United States Patent
Park et al.

(10) Patent No.: US 12,525,529 B2
(45) Date of Patent: Jan. 13, 2026

(54) FORMING LINE END VIAS

(71) Applicant: International Business Machines Corporation, Armonk, NY (US)

(72) Inventors: Chanro Park, Clifton Park, NY (US); Yann Mignot, Slingerlands, NY (US); Nicholas Anthony Lanzillo, Wynantskill, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 799 days.

(21) Appl. No.: 17/667,492

(22) Filed: Feb. 8, 2022

(65) Prior Publication Data
US 2023/0253307 A1    Aug. 10, 2023

(51) Int. Cl.
H01L 23/522 (2006.01)
H01L 21/768 (2006.01)

(52) U.S. Cl.
CPC .... H01L 23/5226 (2013.01); H01L 21/76819 (2013.01); H01L 21/76829 (2013.01); H01L 21/76877 (2013.01)

(58) Field of Classification Search
CPC ........... H01L 23/5226; H01L 21/76819; H01L 21/76829; H01L 21/76877
See application file for complete search history.

(56) References Cited

U.S. PATENT DOCUMENTS

| | | | |
|---|---|---|---|
| 5,888,897 A | 3/1999 | Liang | |
| 6,015,751 A | 1/2000 | Liu | |
| 6,974,772 B1 * | 12/2005 | King | H01L 21/76829 438/700 |
| 7,763,532 B2 * | 7/2010 | Frohberg | H01L 21/31116 438/682 |
| 8,143,663 B2 * | 3/2012 | Jeong | H10B 41/44 257/314 |
| 9,236,292 B2 | 1/2016 | Romero | |
| 9,236,342 B2 | 1/2016 | Bristol | |
| 9,312,222 B2 | 4/2016 | Ting | |

(Continued)

FOREIGN PATENT DOCUMENTS

| | | | | | |
|---|---|---|---|---|---|
| CN | 101685826 A | * | 3/2010 | | H10B 63/10 |
| CN | 102751304 B | * | 6/2015 | | H10B 63/10 |

(Continued)

OTHER PUBLICATIONS

Anonymous, "A Structure and Method for bi-directionally self-aligned vias (bSAV)", IPCOM000201787D, Nov. 23, 2010.

(Continued)

*Primary Examiner* — Laura M Menz

(74) *Attorney, Agent, or Firm* — Seed Intellectual Property Law Group LLP

(57) ABSTRACT

An integrated circuit structure includes a metal line that has an upper surface defining a periphery; a dielectric spacer that is formed around the periphery of the upper surface of the metal line; and a metal via that contacts the metal line and the dielectric spacer adjacent to the periphery of the upper surface. A method for making a semiconductor structure includes depositing a spacer around the periphery of an upper surface of a metal line; and depositing a via onto the metal line, so that a part of the via overlaps the spacer.

12 Claims, 29 Drawing Sheets

(56) References Cited

U.S. PATENT DOCUMENTS

| | | | |
|---|---|---|---|
| 9,324,650 B2 | 4/2016 | Edelstein | |
| 9,607,893 B1 | 3/2017 | Zhang | |
| 9,793,164 B2 | 10/2017 | Machkaoutsan | |
| 9,953,865 B1 | 4/2018 | Briggs | |
| 9,953,869 B2 | 4/2018 | Murray | |
| 9,960,110 B2* | 5/2018 | Boyanov | H01L 23/522 |
| 10,020,223 B1 | 7/2018 | Anderson | |
| 10,832,947 B2 | 11/2020 | Park | |
| 11,201,056 B2* | 12/2021 | Park | H01L 21/0338 |
| 11,355,442 B2* | 6/2022 | Dutta | H01L 21/76838 |
| 11,355,637 B2* | 6/2022 | Fu | H10D 84/038 |
| 11,769,770 B2* | 9/2023 | Huang | H10D 84/038 |
| | | | 257/288 |
| 11,923,311 B2* | 3/2024 | Dutta | H01L 21/76816 |
| 12,094,774 B2* | 9/2024 | Mignot | H01L 21/7682 |
| 12,211,825 B2* | 1/2025 | Yun | H10N 70/24 |
| 2005/0048753 A1* | 3/2005 | Schwan | H10D 64/015 |
| | | | 438/303 |
| 2006/0094215 A1* | 5/2006 | Frohberg | H10D 86/01 |
| | | | 257/E21.252 |
| 2009/0242948 A1* | 10/2009 | Barrett | H10F 39/024 |
| | | | 257/E31.127 |
| 2009/0283807 A1* | 11/2009 | Adkisson | H10F 30/221 |
| | | | 257/292 |
| 2009/0286346 A1* | 11/2009 | Adkisson | H10F 39/806 |
| | | | 257/E31.13 |
| 2013/0328208 A1 | 12/2013 | Holmes | |
| 2014/0151893 A1* | 6/2014 | Boyanov | H01L 21/76883 |
| | | | 257/774 |
| 2014/0312508 A1* | 10/2014 | Boyanov | H01L 21/76883 |
| | | | 257/774 |
| 2016/0190009 A1 | 6/2016 | Wallace | |
| 2017/0011998 A1* | 1/2017 | Boyanov | H01L 23/53295 |
| 2017/0053863 A1* | 2/2017 | Lu | H01L 21/76843 |
| 2017/0352591 A1 | 12/2017 | Zhang | |
| 2018/0040510 A1 | 2/2018 | Briggs | |
| 2018/0151432 A1 | 5/2018 | Chen | |
| 2019/0189512 A1 | 6/2019 | Zhang | |
| 2019/0311984 A1 | 10/2019 | Lin | |
| 2020/0020568 A1* | 1/2020 | Lin | H01L 21/7682 |
| 2020/0203212 A1* | 6/2020 | Reshotko | H01L 21/76837 |
| 2021/0082746 A1* | 3/2021 | Arnold | H01L 23/5226 |
| 2021/0082803 A1* | 3/2021 | Wang | H01L 21/76852 |
| 2021/0296127 A1* | 9/2021 | Park | H01L 21/0332 |
| 2021/0375751 A1* | 12/2021 | Dai | H01L 23/5226 |
| 2022/0310441 A1* | 9/2022 | Su | H01L 23/53295 |
| 2023/0061475 A1* | 3/2023 | Yun | H10N 70/823 |
| 2023/0085494 A1* | 3/2023 | Mignot | H01L 21/76816 |
| | | | 257/774 |
| 2023/0230919 A1* | 7/2023 | Kabir | H01L 21/76843 |
| | | | 257/536 |
| 2023/0253307 A1* | 8/2023 | Park | H01L 21/76843 |
| | | | 257/774 |
| 2023/0422629 A1* | 12/2023 | van der Straten | H10N 50/85 |
| 2024/0206345 A1* | 6/2024 | Dutta | H10N 50/10 |
| 2024/0387475 A1* | 11/2024 | Yun | H01L 25/074 |
| 2024/0413085 A1* | 12/2024 | Xie | H10D 88/00 |

FOREIGN PATENT DOCUMENTS

| | | | | |
|---|---|---|---|---|
| CN | 113451266 A | * | 9/2021 | H01L 23/528 |
| CN | 114823498 A | * | 7/2022 | H01L 21/76877 |
| DE | 10339989 A1 | * | 4/2005 | H10D 84/0184 |
| DE | 102020119099 B4 | * | 6/2022 | H10D 84/0158 |
| DE | 102022108252 A1 | * | 4/2023 | H10D 84/85 |
| JP | 2011114048 A | * | 6/2011 | G11C 16/0466 |
| TW | 202331790 A | * | 8/2023 | H10D 84/85 |
| TW | I815134 B | * | 9/2023 | H10D 84/0158 |
| WO | WO-2013101204 A1 | * | 7/2013 | H01L 21/76897 |
| WO | 2017111868 W | | 6/2017 | |
| WO | WO-2021208195 A1 | * | 10/2021 | H10B 43/27 |
| WO | WO-2024256095 A1 | * | 12/2024 | H10D 30/0198 |

OTHER PUBLICATIONS

Anonymous, "Bi-directionally self-aligned vias", IPCOM000231097D Sep. 26, 2013.

Briggs et al., "Fully aligned via integration for extendibility of interconnects to beyond the 7 nm node." In 2017 IEEE International Electron Devices Meeting (IEDM), pp. 14-2-1 to 4, Dec. 2017.

* cited by examiner

FORMING LINE END VIAS

BACKGROUND

The present invention relates to the electrical, electronic, and computer arts, and more specifically, to fabrication of integrated circuits.

In building an integrated circuit, especially at modern process nodes (components of very small size and spacing), it can be difficult to prevent inadvertent electrical connections that can arise from manufacturing process errors. One sort of electrical short that can occur is a line-to-line short when the tips of two metal lines touch in the back-end-of-line (BEOL) layers. To prevent such shorts, circuit designers impose a constraint (herein referred to as "tip to tip," and marked in the accompanying drawings as "T2T"), which is a minimum permissible distance between line ends in a circuit's mechanical design. T2T limits how closely lines and components can be packed in an integrated circuit design.

One issue that can lead to violations of T2T constraints is that the alignment of vias to lines can be difficult to control. Sometimes vias do not perfectly line up with their intended locations in the design. In order to comply with the T2T constraint, despite the known variability of via location, another constraint (herein referred to as "via enclosure," and marked in the accompanying drawings as "VE") sets a minimum permissible offset from a line end inward (along the line) to a via position. Via enclosure can impact how many vias can be fit into a layer.

SUMMARY

Principles of the invention provide techniques for forming line end vias. In one aspect, an exemplary integrated circuit structure includes a metal line that has an upper surface defining a periphery; a dielectric spacer around the periphery of the upper surface of the metal line; and a metal via that contacts the metal line and the dielectric spacer adjacent to the periphery of the upper surface.

According to another aspect, an exemplary method for making a semiconductor structure includes depositing a spacer around the periphery of an upper surface of a metal line; and depositing a via onto the metal line, so that a part of the via overlaps the spacer.

In view of the foregoing, techniques of the present invention can provide substantial beneficial technical effects. For example, one or more embodiments provide one or more of:

Fabrication of line end vias without violating tip to tip constraint and without requiring via enclosure constraint.

Etch stop layer is confined only on metal line surface and inner surface of dielectric spacer.

Higher component density for same process node.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

DETAILED DESCRIPTION

In building an integrated circuit, especially at modern process nodes (components of very small size and spacing), it can be difficult to prevent inadvertent electrical connections that can arise from manufacturing process errors. One sort of electrical short that can occur is a line-to-line short when the tips of two metal lines touch in the back-end-of-line (BEOL) layers. To prevent such shorts, circuit designers impose a constraint (herein referred to as "tip to tip," and marked in the accompanying drawings as "T2T"), which is a minimum permissible distance between line ends in a circuit's mechanical design. T2T limits how closely lines and components can be packed in an integrated circuit design.

One issue that can lead to violations of T2T constraints is that the alignment of vias to lines can be difficult to control. Sometimes, vias do not perfectly line up with their intended locations in the design. In order to comply with the T2T constraint, despite the known variability of via location, another constraint (herein referred to as "via enclosure," and marked in the accompanying drawings as "VE") sets a minimum permissible offset, from a line end, inward (along the line), to a via position. Via enclosure can impact how many vias can be fit into a layer.

Figure 1:
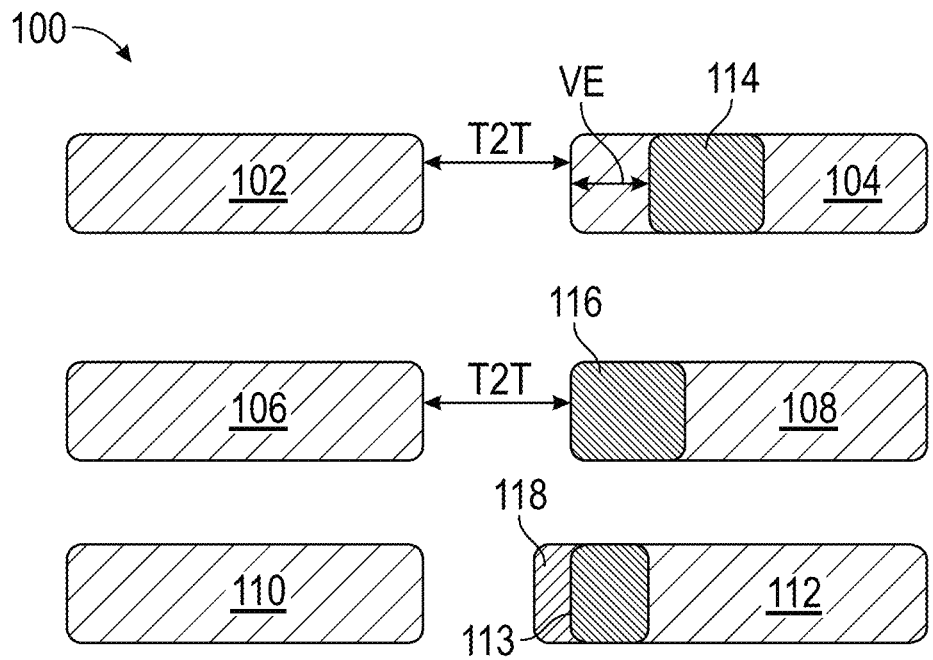
FIG. 1 depicts a plan view of an array of metal lines with tip-to-tip and via enclosure constraints observed and violated.

FIG. 1 depicts a plan view of an array 100 of metal lines 102, 104, 106, 108, 110, 112 and vias 114, 116, 118. In the array 100, the above-mentioned tip-to-tip constraint T2T is implemented in lines 102, 104, 106, 108, where the vias 114 and 116 do not overhang into the prescribed gaps between the lines. Via enclosure constraint VE is implemented in line 104 only, where via 114 is offset inward by the distance VE from the tip of line 104. The T2T constraint is violated in lines 110, 112, where via 118 protrudes over the tip 113 of line 112 so that it is too close to line 110. VE is violated in line 108, where via 116 is right at the tip of line 108 rather than being offset inward from the tip by the appropriate distance VE. VE also is violated in line 112, where via 118 actually overhangs the tip of the line toward line 110. Violations of VE (and consequently, violations of T2T) can occur frequently when using photolithographic processes in modern process nodes, e.g., sub-20 nm technology nodes.

Figure 2:
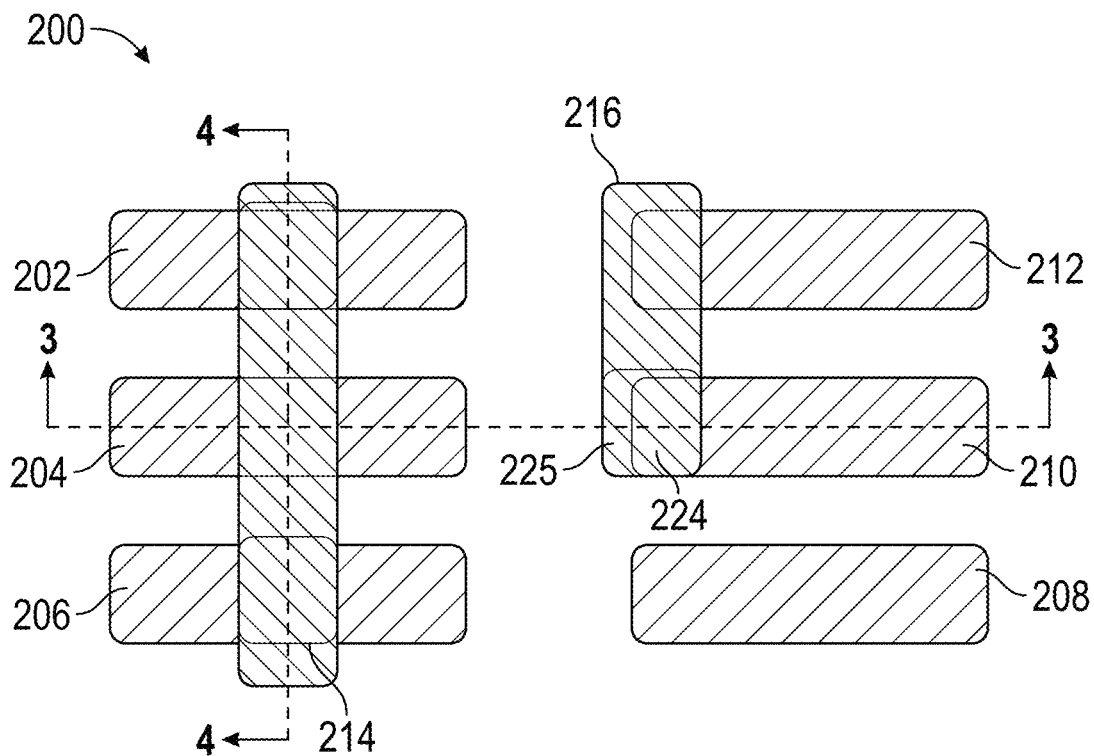
FIG. 2 depicts a plan view of an array of metal lines with spacers containing line end vias, according to exemplary embodiments.
Figure 3:
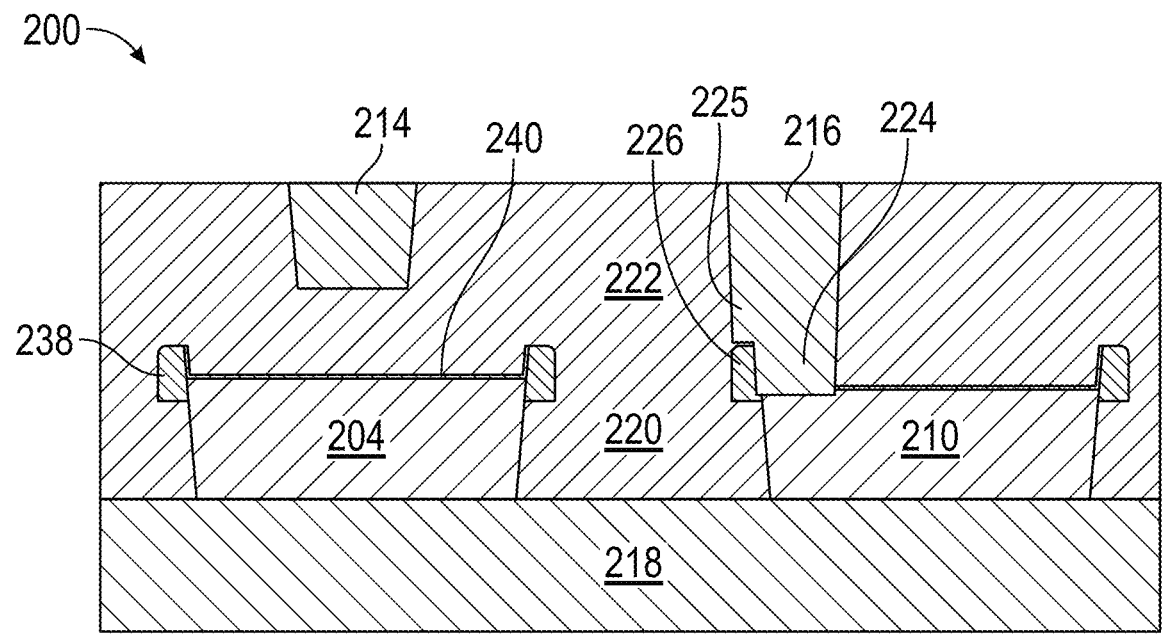
FIG. 3 depicts a sectioned view of the array of metal lines that are shown in FIG. 2.
Figure 4:
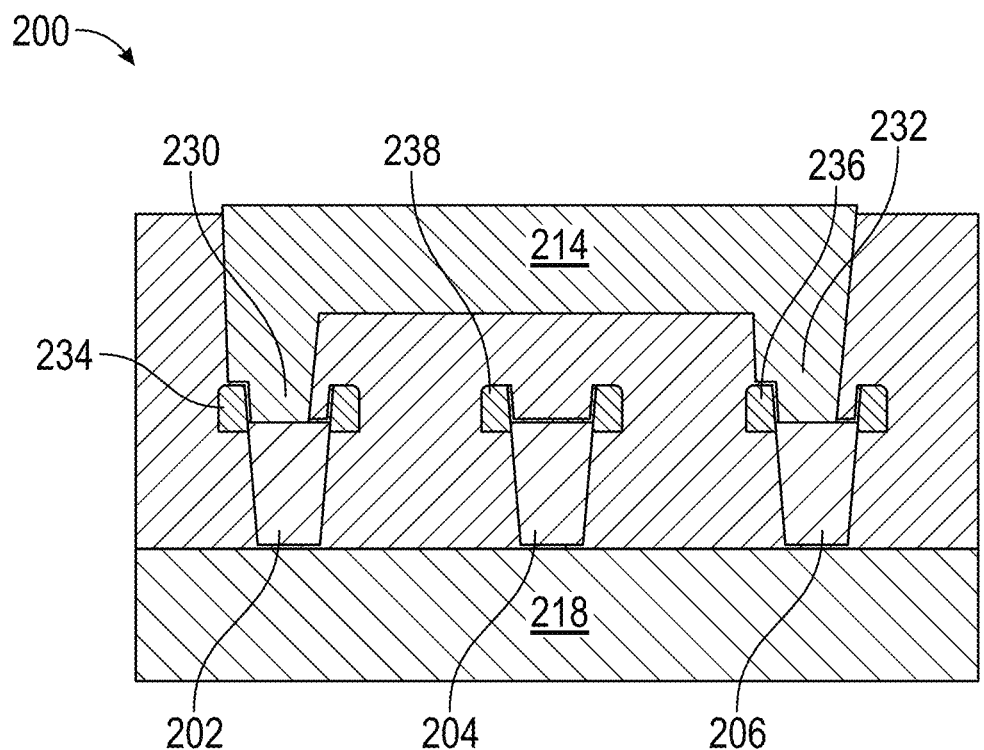
FIG. 4 depicts a sectioned view of the array of metal lines that are shown in FIG. 2.

FIG. 2 through FIG. 4 depict plan and section views of a structure 200 that comprises an array of lower level metal lines 202, 204, 206, 208, 210, 212, upper level lines 214, 216, and vias 224, 230, 232, which are built on a substrate 218 with dielectric layers 220 and 222 separating the conductive components. The fabrication process for the structure 200 mitigates VE and T2T violations by providing dielectric spacers (e.g., 226, 234, 236) that surround the upper surfaces of lines 210, 202, and 206, respectively, in order to isolate, from the adjoining lines, those portions of the respective vias 224, 230, 232 that would otherwise overhang the edges of the lines and infringe T2T when VE is violated. For example, in FIG. 3, the spacer 226 "contains" the overhanging portion 225 of via 224 by providing additional isolation between the overhang 225 and the adjacent tip of the line 204. An additional dielectric spacer 238 surrounds the top of line 204.

As a relic of fabrication processes, further discussed below, an etch stop layer 240 covers the lines and inner surfaces of the spacers facing the lines, except where vias are present. A barrier metal layer and a liner metal layer, between the lines and the dielectric, are not shown for convenience of illustration; the skillful worker is familiar with those layers and with methods for their fabrication. Exemplary materials for the metal lines and vias include copper, aluminum, tungsten, ruthenium, and tantalum. Commonly used materials for the substrate include silicon and silicon-germanium alloys. Exemplary materials for the dielectric layers include silicon oxides, silicon nitrides, titanium oxides, titanium nitrides. Commonly used etch stop materials include silicon nitride, silicon carbide, silicon carbonitride, and the like. Exemplary materials for a diffusion barrier layer include, in one or more embodiments, tantalum nitride, titanium nitride, indium oxide, copper silicide, tungsten nitride.

Figure 5:
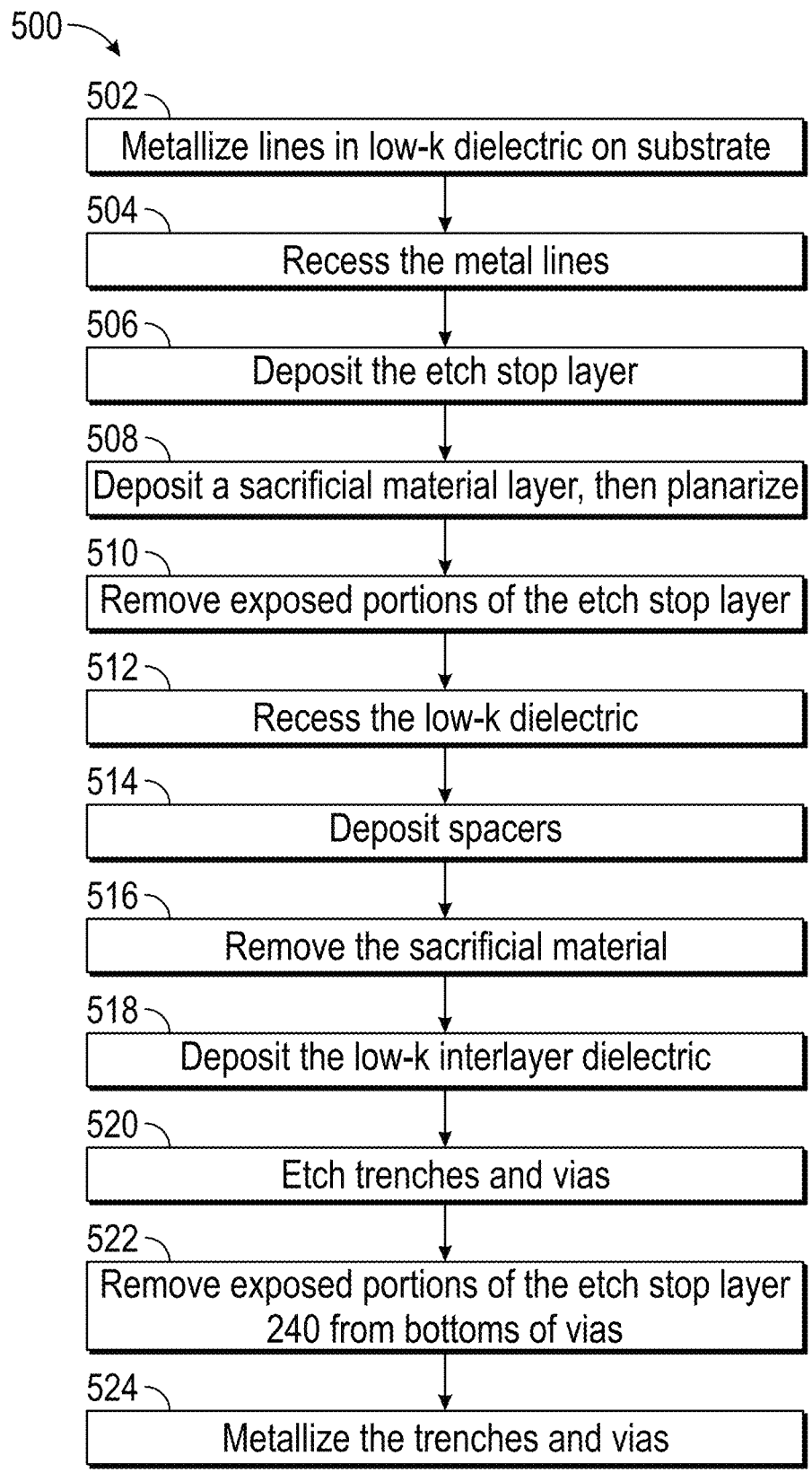
FIG. 5 depicts a flow chart of steps in a process for forming the array of metal lines shown in FIG. 2 through FIG. 4, according to exemplary embodiments.

FIG. 5 depicts a flow chart of steps in a process 500 for forming the structure 200 that is shown in FIG. 2 through FIG. 4, according to exemplary embodiments. FIG. 6 through FIG. 38 depict plan and sectioned views of intermediate structures formed by selected steps of FIG. 5.

Figure 6:
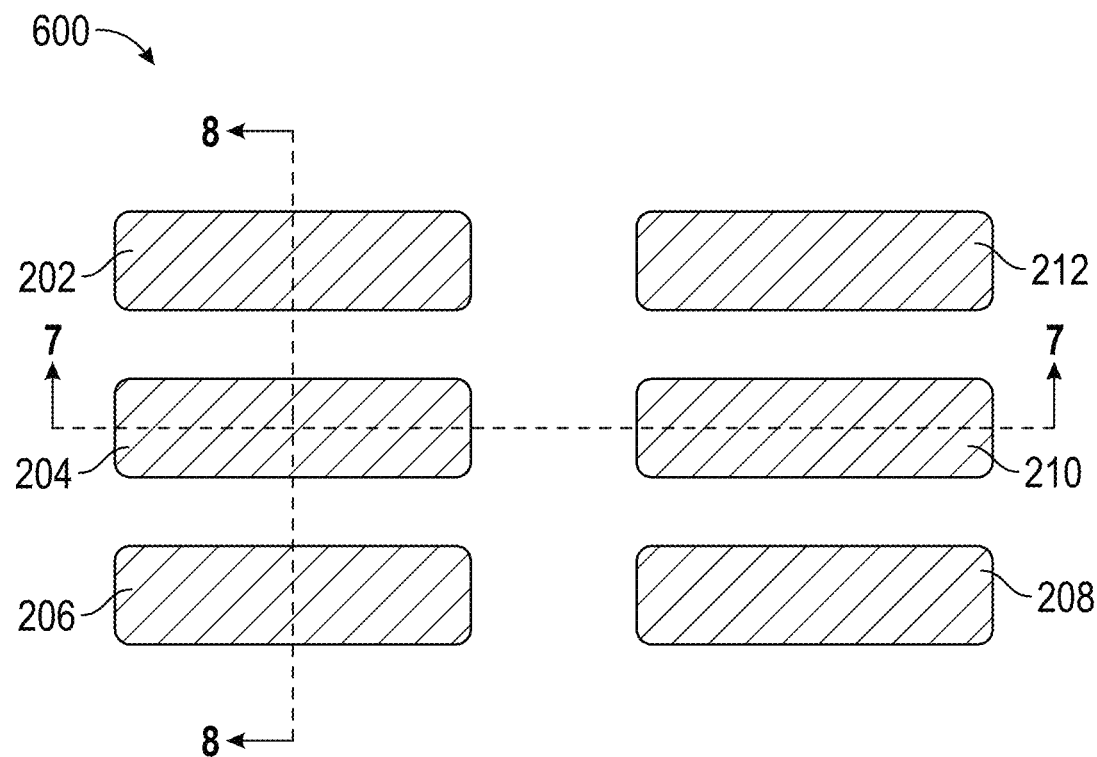
FIG. 6 through FIG. 38 depict plan and sectioned views of intermediate structures formed by selected steps of FIG. 5.
Figure 7:
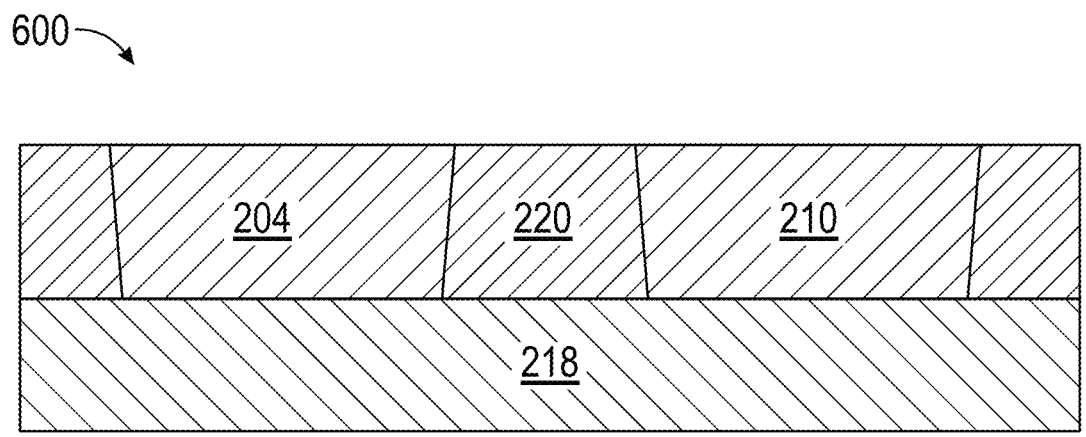
Figure 8:
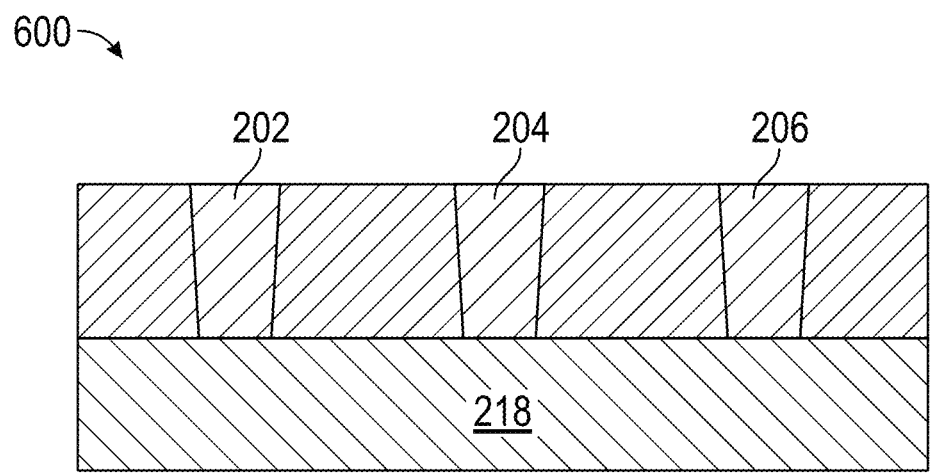

At 502, form a precursor structure 600 (as shown in FIG. 6 through FIG. 8), by methods known to the skillful worker, in which lines 202, 204, 206, 208, 210, 212 are metallized in low-k dielectric layer 220 on substrate 218.

Figure 9:
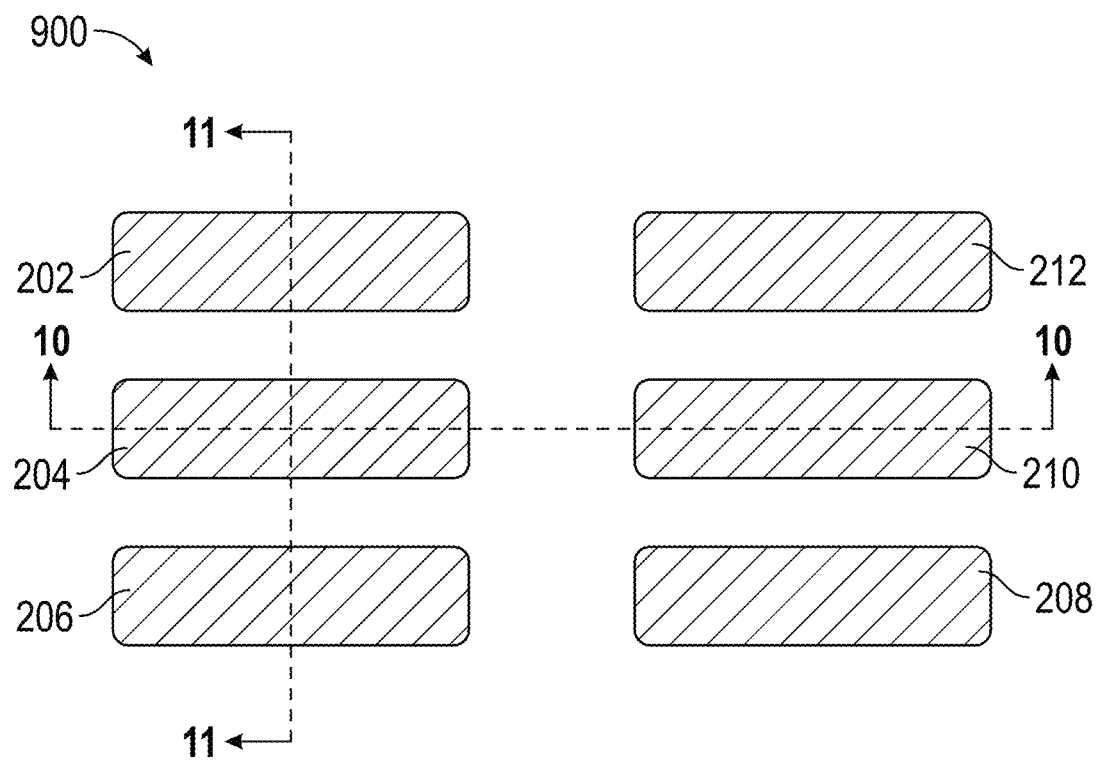
Figure 10:
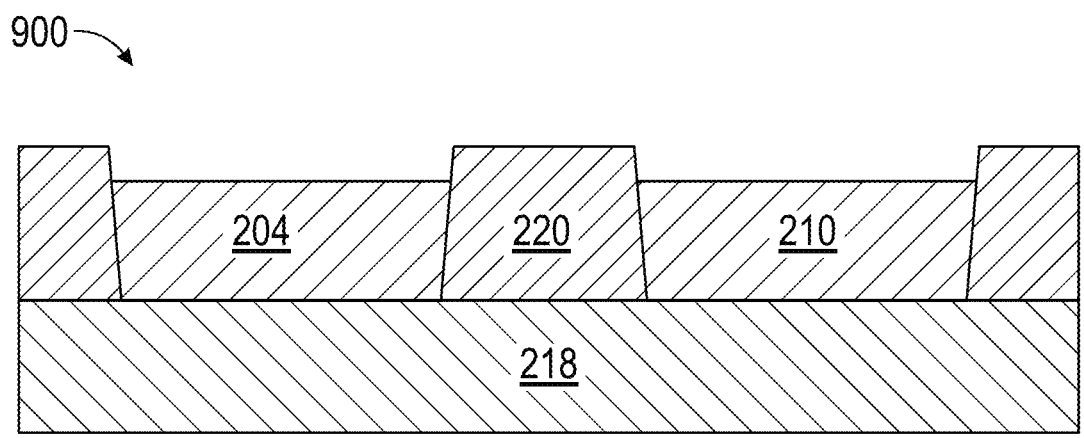
Figure 11:
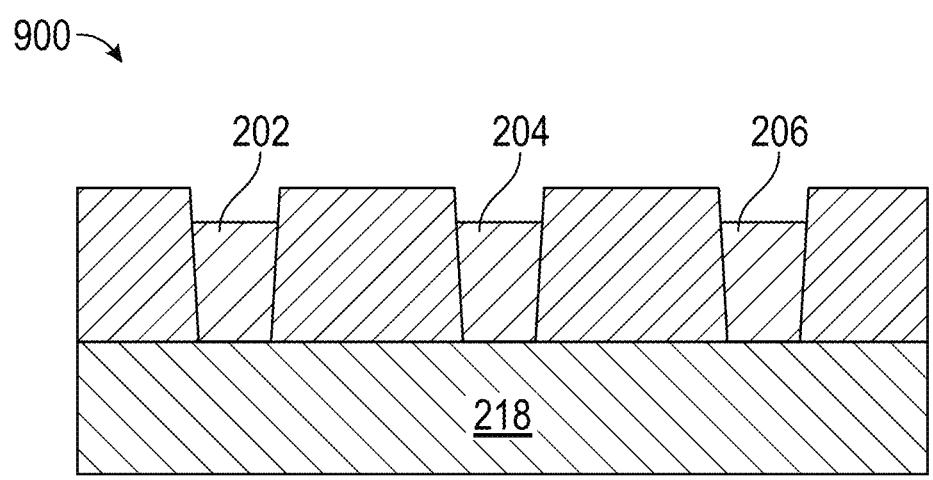
Figure 12:
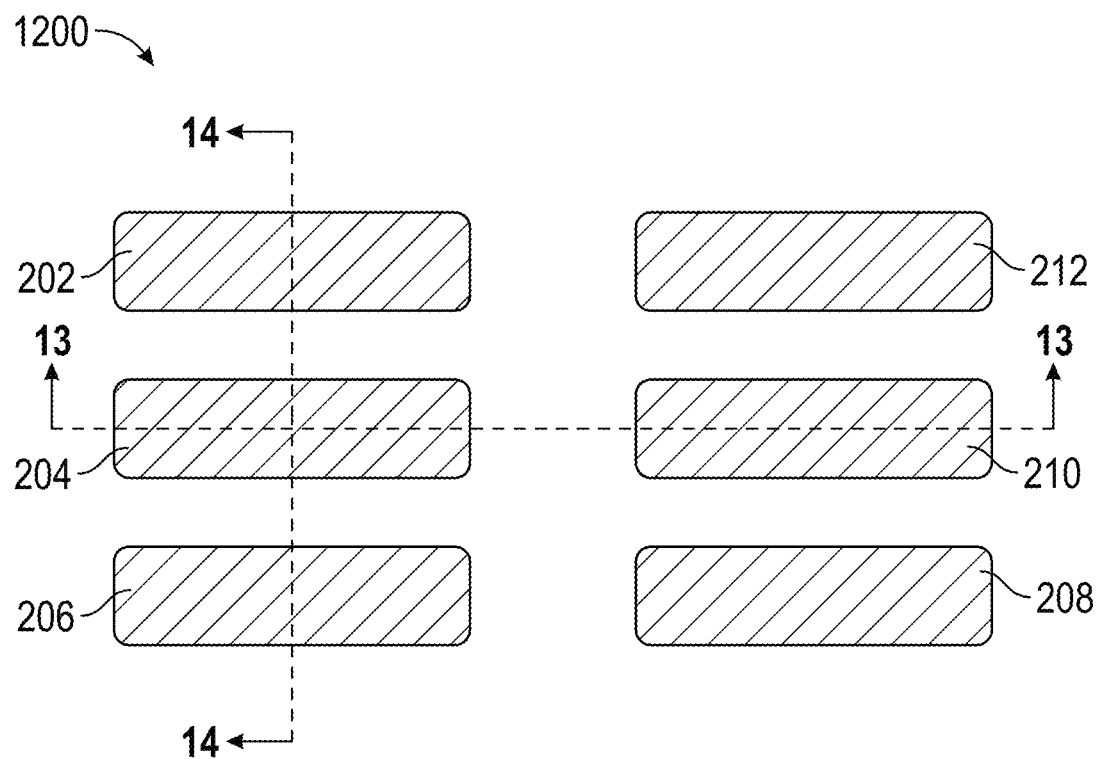
Figure 13:
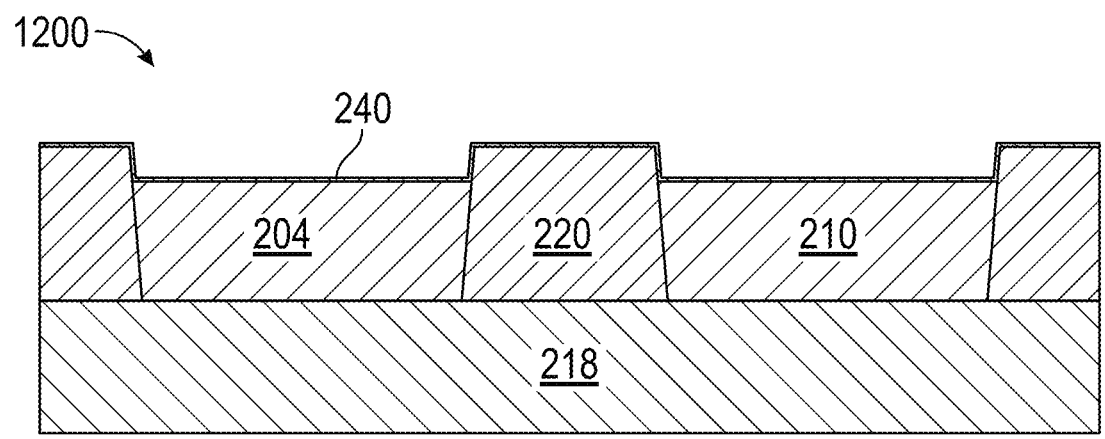
Figure 14:
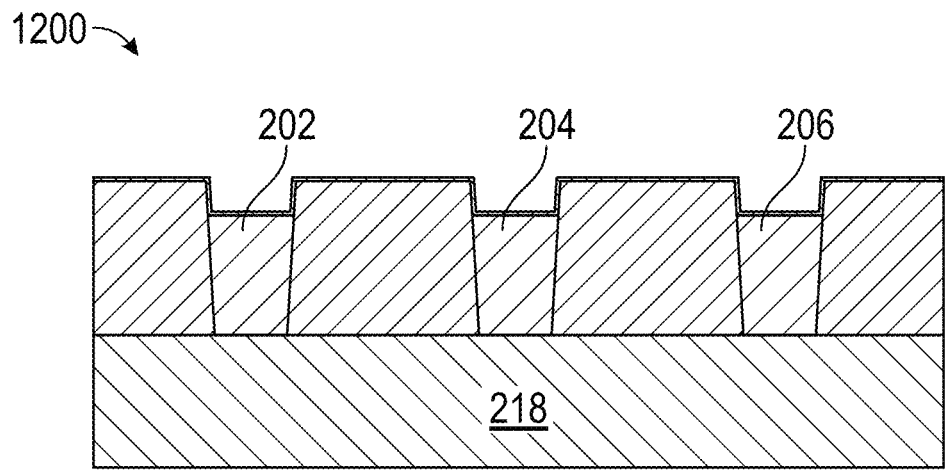

At 504, form an intermediate structure 900 (as shown in FIG. 9 through FIG. 11) by recessing the metal lines. A metal/liner/barrier recess process is well known to the skillful worker. Exemplary materials for these layers, in one or more embodiments, include copper (Cu) metal with a cobalt (Co) barrier and a tantalum nitride (TaN) liner, At 506, form an intermediate structure 1200 (as shown in FIG. 12 through FIG. 14) by depositing the etch stop layer 240. In one or more embodiments, the etch stop layer 240 may comprise aluminum oxide ($AlO_x$), zirconium oxide ($ZrO_x$), or hafnium oxide ($HfO_x$), with a thickness of about 1 to about 5 nanometers (nm).

Figure 15:
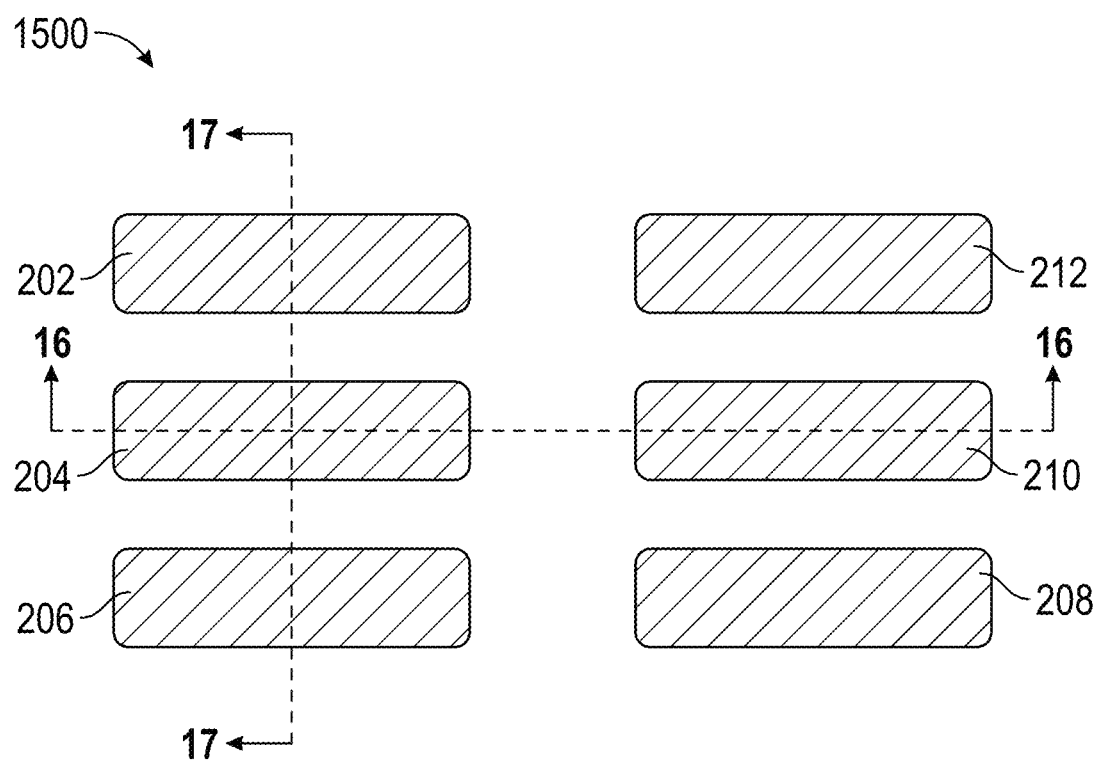
Figure 16:
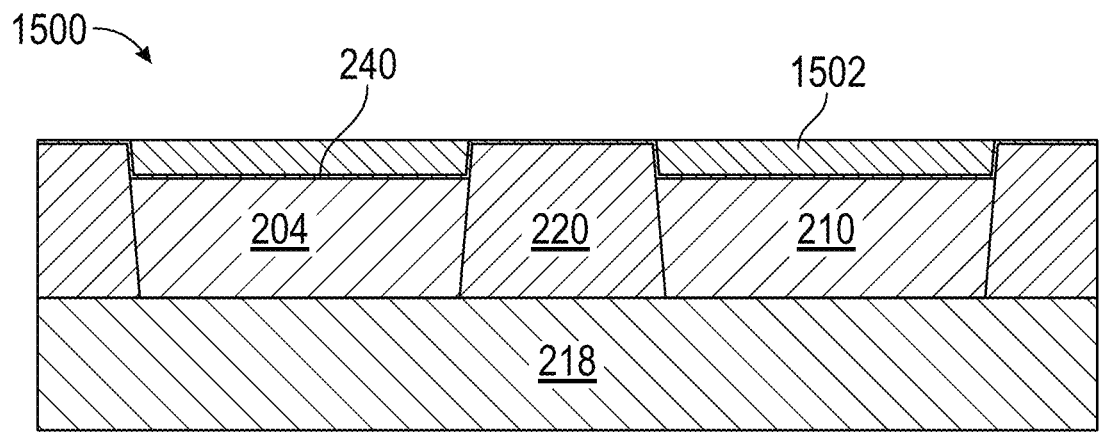
Figure 17:
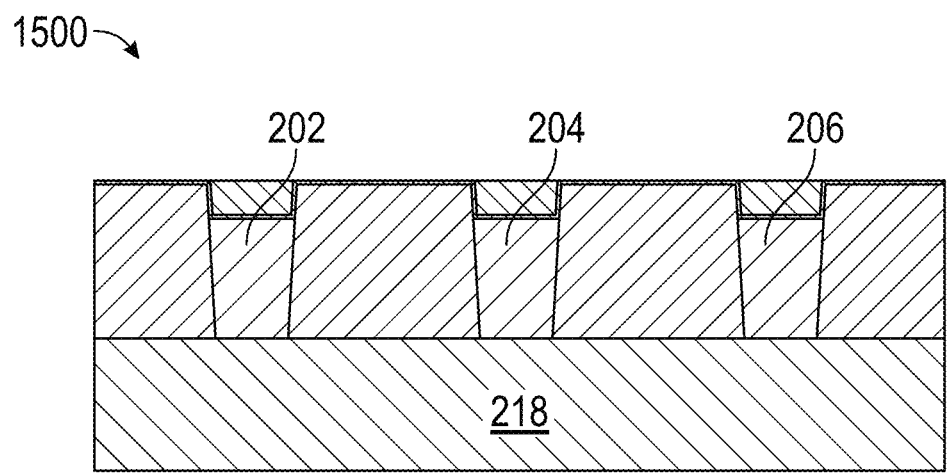

At 508, form an intermediate structure 1500 (as shown in FIG. 15 through FIG. 17) by depositing a layer of sacrificial material 1502, then planarizing. In one or more embodiments, the sacrificial material can be metal, semiconductor, or dielectric. An appropriate sacrificial material can be removed (at step 516) selective to the low-k dielectric and spacer materials by a given etch process. For example, in one or more embodiments, the sacrificial material can be amorphous silicon germanium (SiGe) with between 0 to 100 percent germanium; silicon dioxide; titanium nitride; or tungsten.

Figure 18:
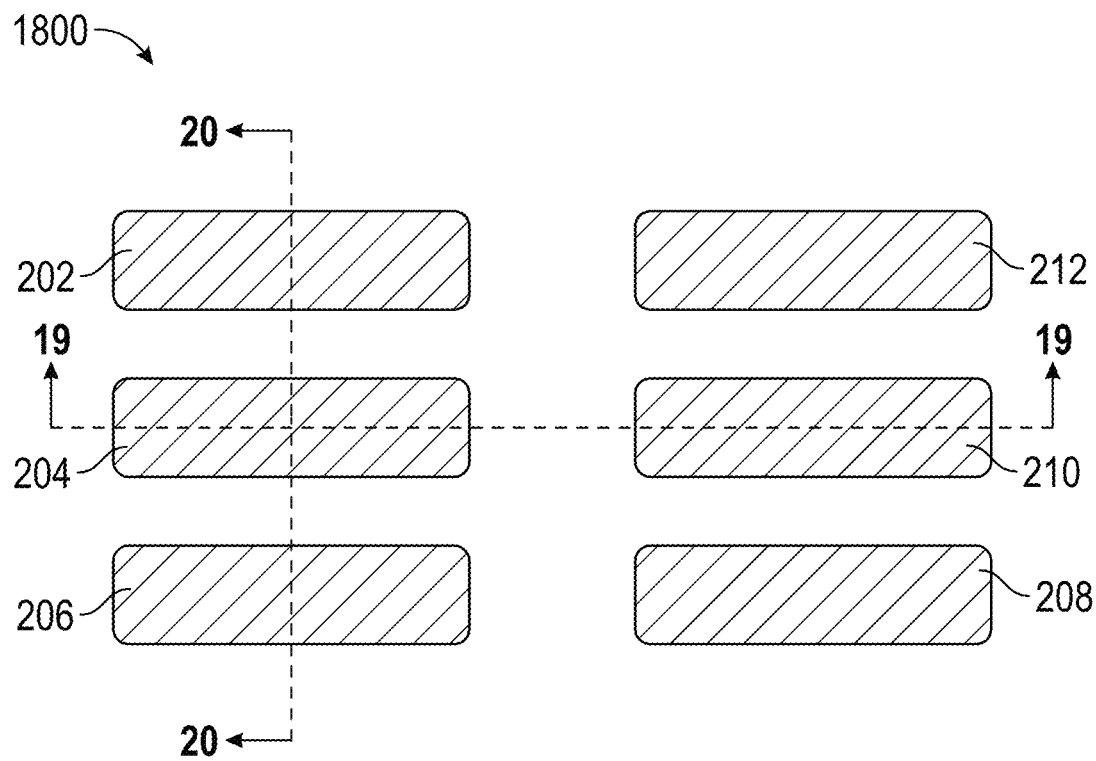
Figure 19:
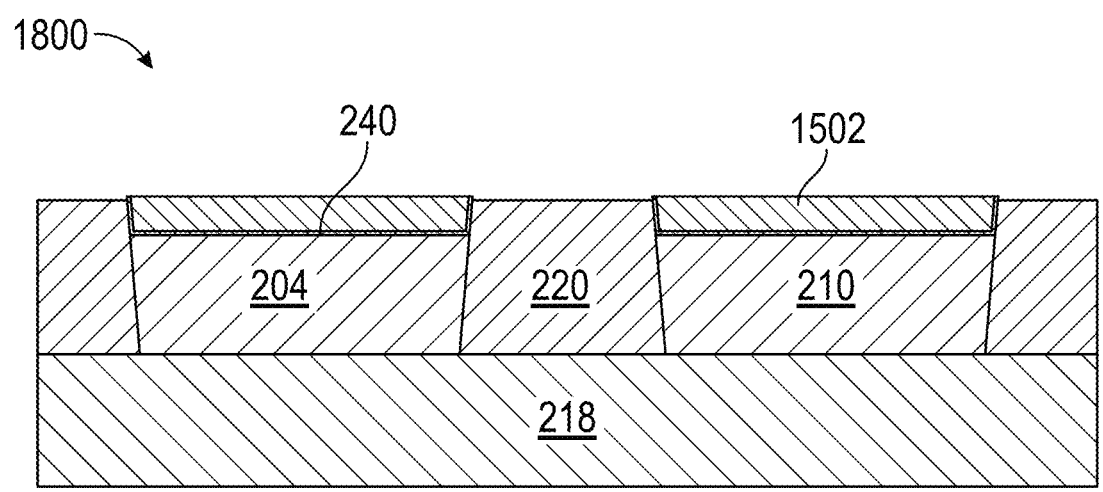
Figure 20:
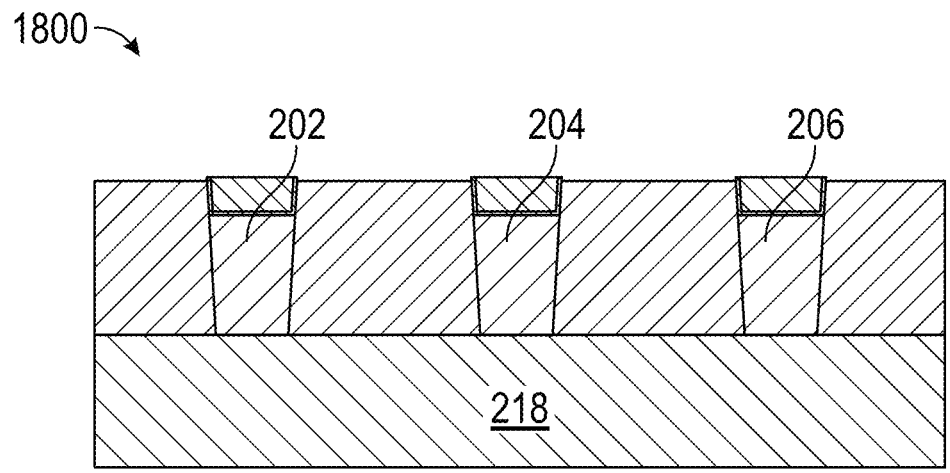

At 510, form an intermediate structure 1800 (as shown in FIG. 18 through FIG. 20) by removing exposed portions of the etch stop layer 240. Etch stop layer removal can be done by a wet or dry etch process according to the material of the etch stop layer. Selective removal can be accomplished by the skillful worker. Step 510 can be combined with step 508, i.e. the etch stop layer 240 can be removed during planarization by, for example, chemical-mechanical polishing.

Figure 21:
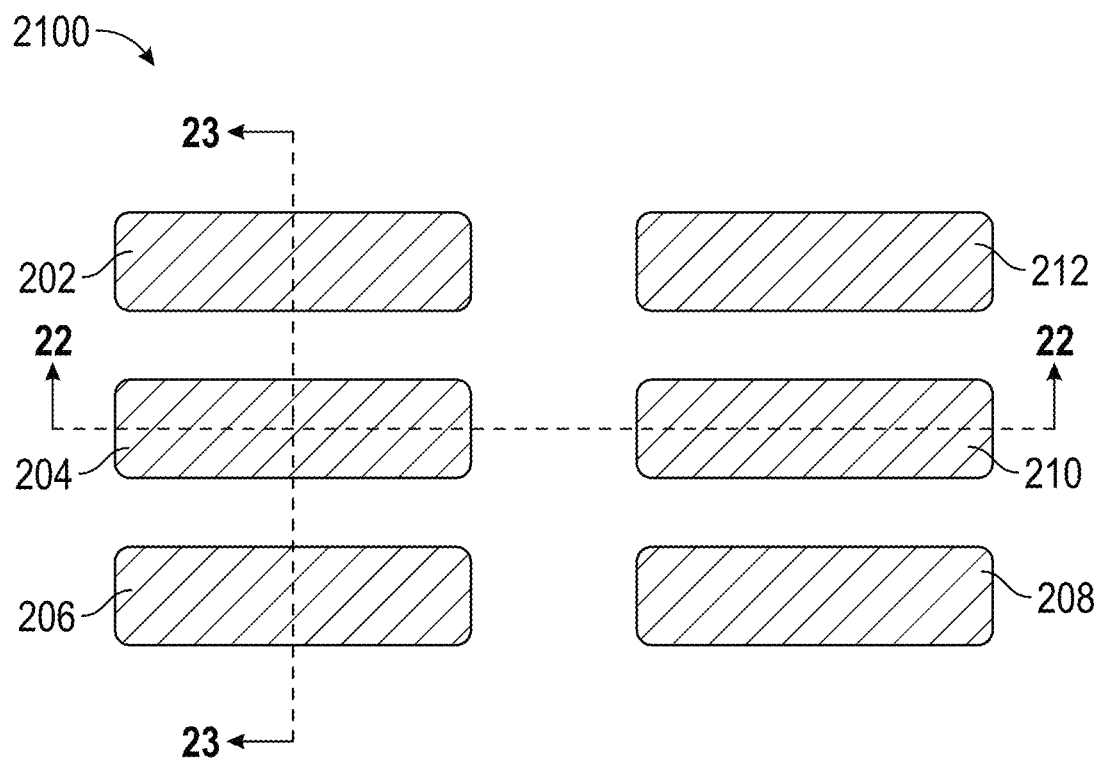
Figure 22:
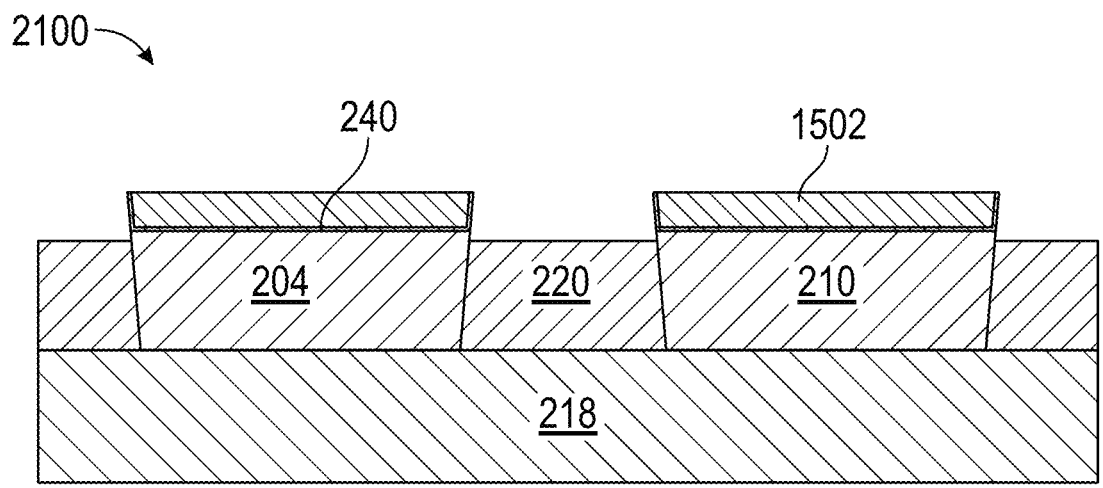
Figure 23:
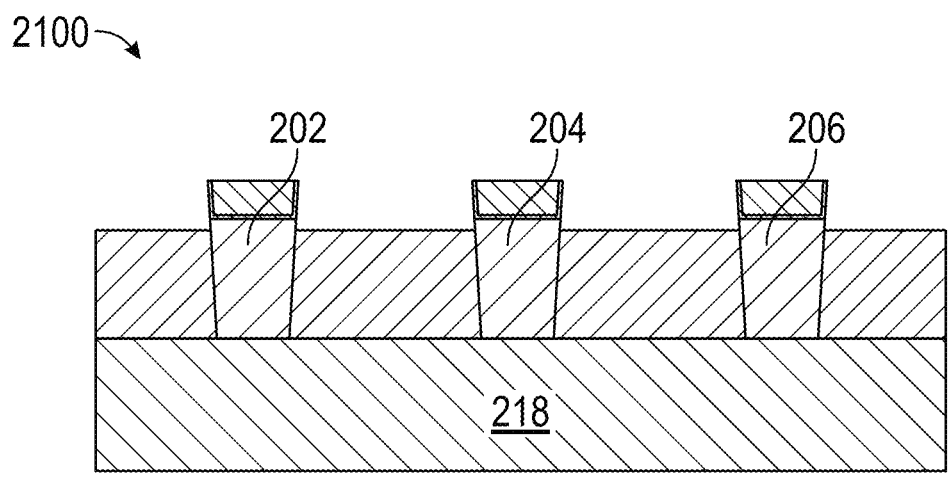

At 512, form an intermediate structure 2100 (as shown in FIG. 21 through FIG. 23) by recessing the low-k dielectric 220. The sacrificial material 1502 protects the metal lines and the etch stop layer during recess process. A target depth of the recess process is, in one or more embodiments, close to the top surface of the recessed metal lines.

Figure 24:
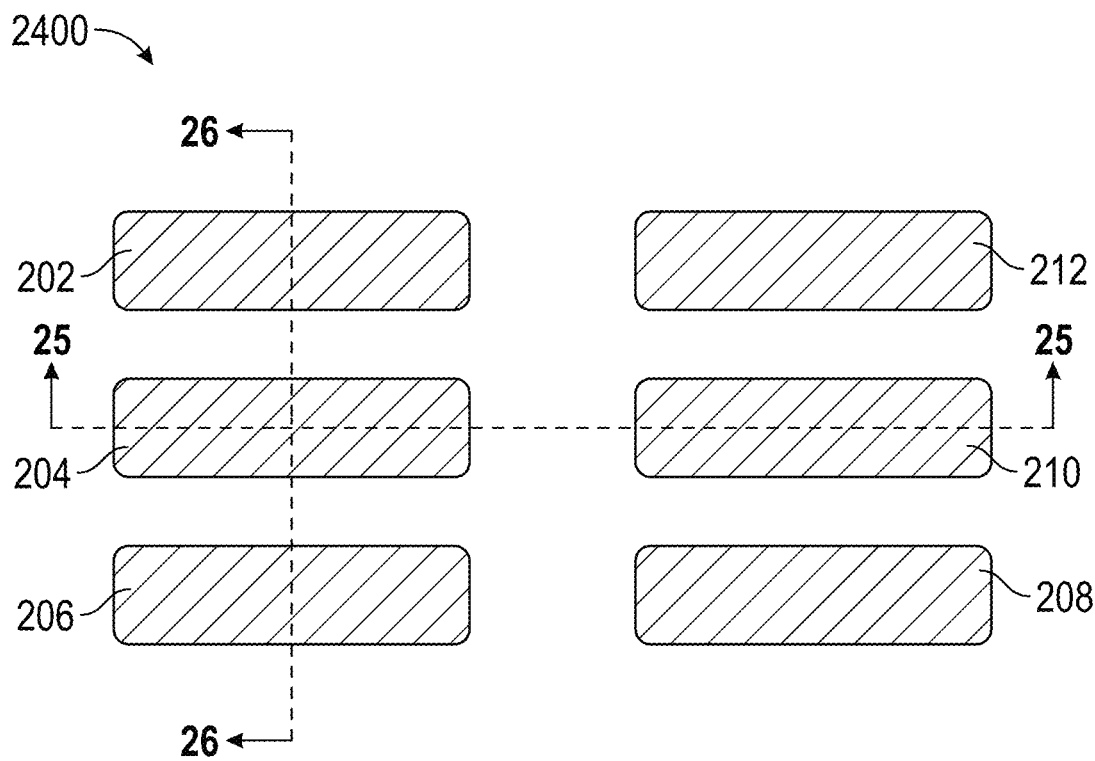
Figure 25:
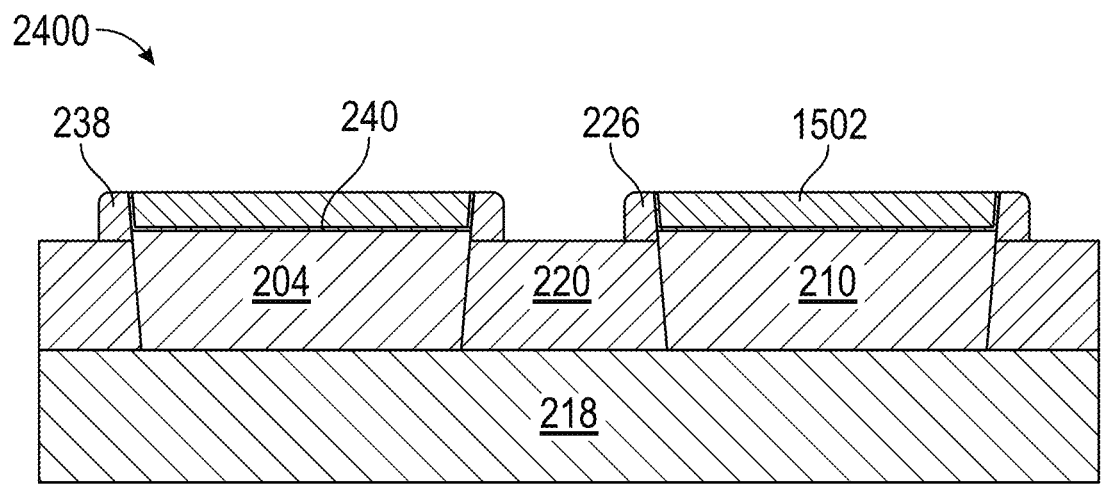
Figure 26:
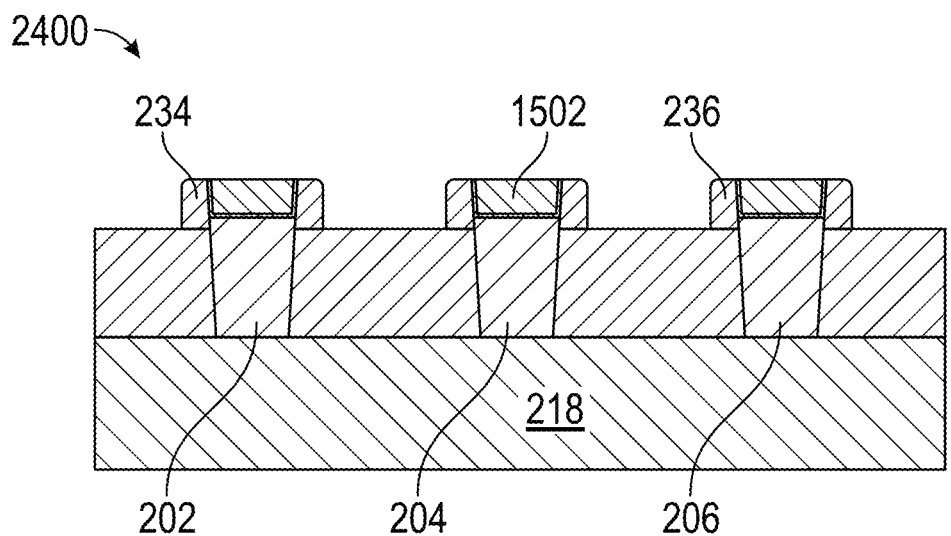

At 514, form an intermediate structure 2400 (as shown in FIG. 24 through FIG. 26) by depositing spacers 226, 234, 236, 238 as well as additional spacers (not shown) around the peripheries of upper surfaces of other lines. In one or more embodiments, a suitable spacer material comprises a nitride that has good etch selectivity to low-k dielectric. Exemplary suitable spacer materials include plain silicon nitride (SiN, dielectric constant about 7.5), silicon carbonitride (SiCN, dielectric constant about 4.8~4.9), silicon borocarbonitride (SiBCN, dielectric constant about 3.7~4.2), or silicon oxycarbonitride (SiOCN, dielectric constant about 2.8~3.5). Advantageously, spacers with smaller dielectric constants will provide a smaller increase of parasitic capacitance between the lines, compared to spacers with larger dielectric constants.

Figure 27:
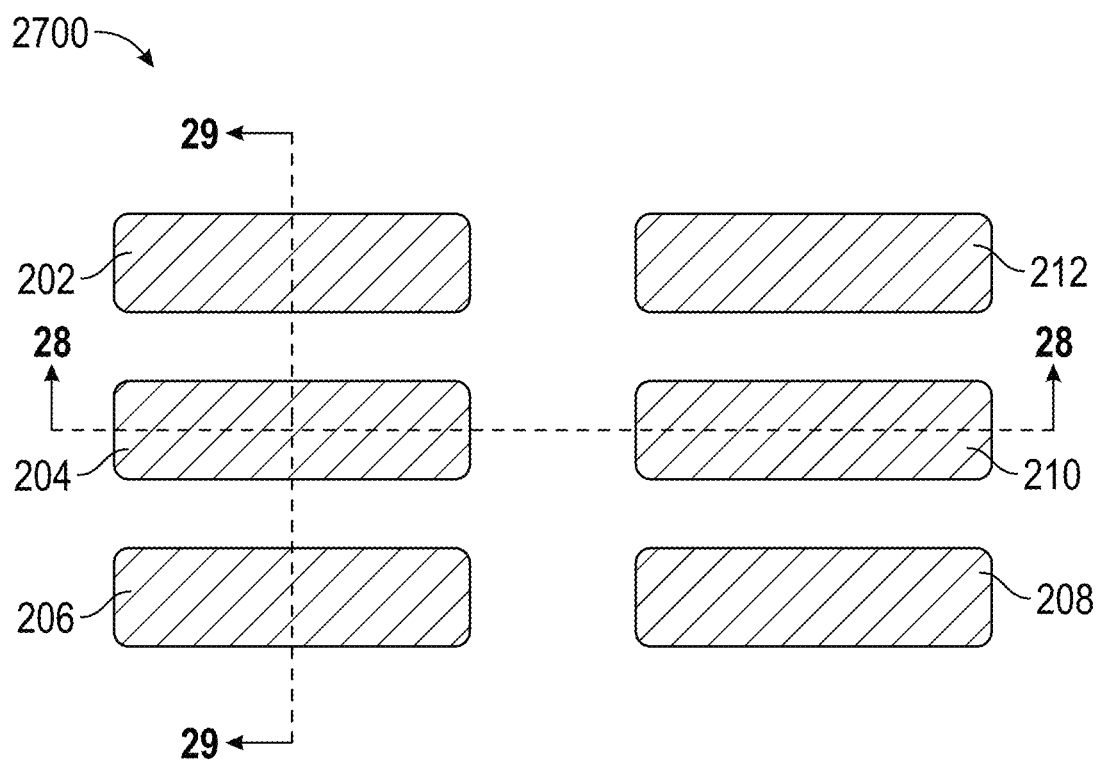
Figure 28:
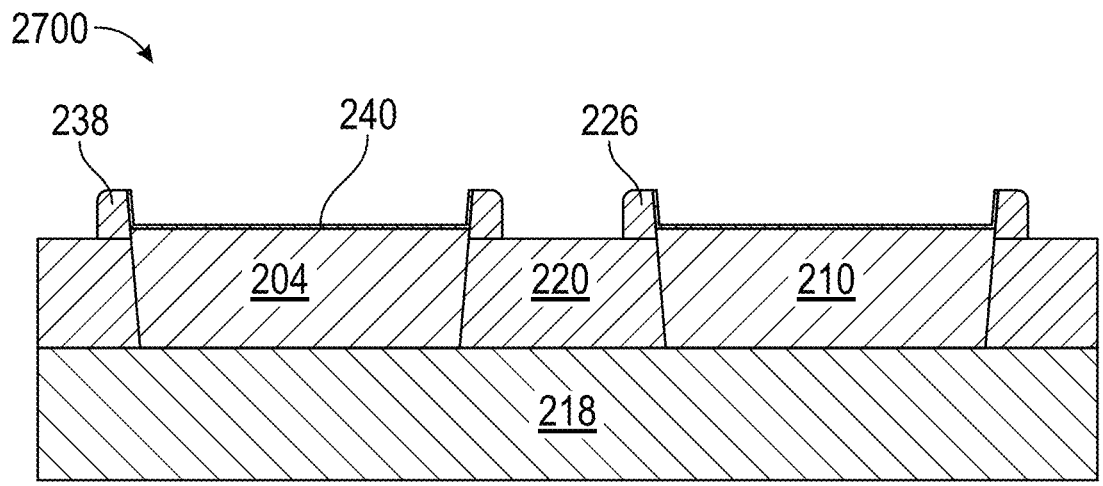
Figure 29:
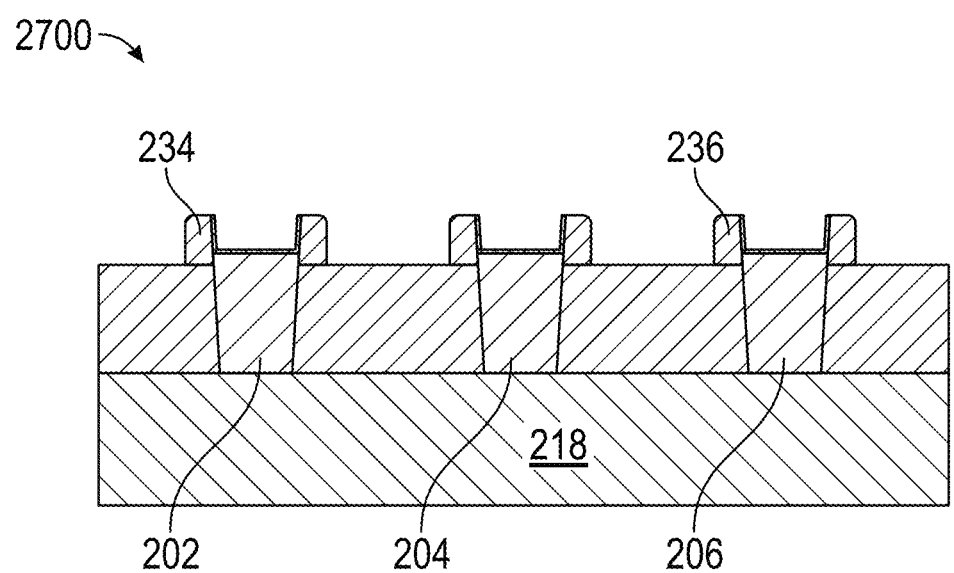

At 516, form an intermediate structure 2700 (as shown in FIG. 27 through FIG. 29) by removing the sacrificial material 1502 (last shown in FIG. 26). The resultant structure has just the substrate 218, lines 202, 204, 206, 208, 210, 212, dielectric 220, spacers 226, 234, 236, 238, and etch stop 240.

Figure 30:
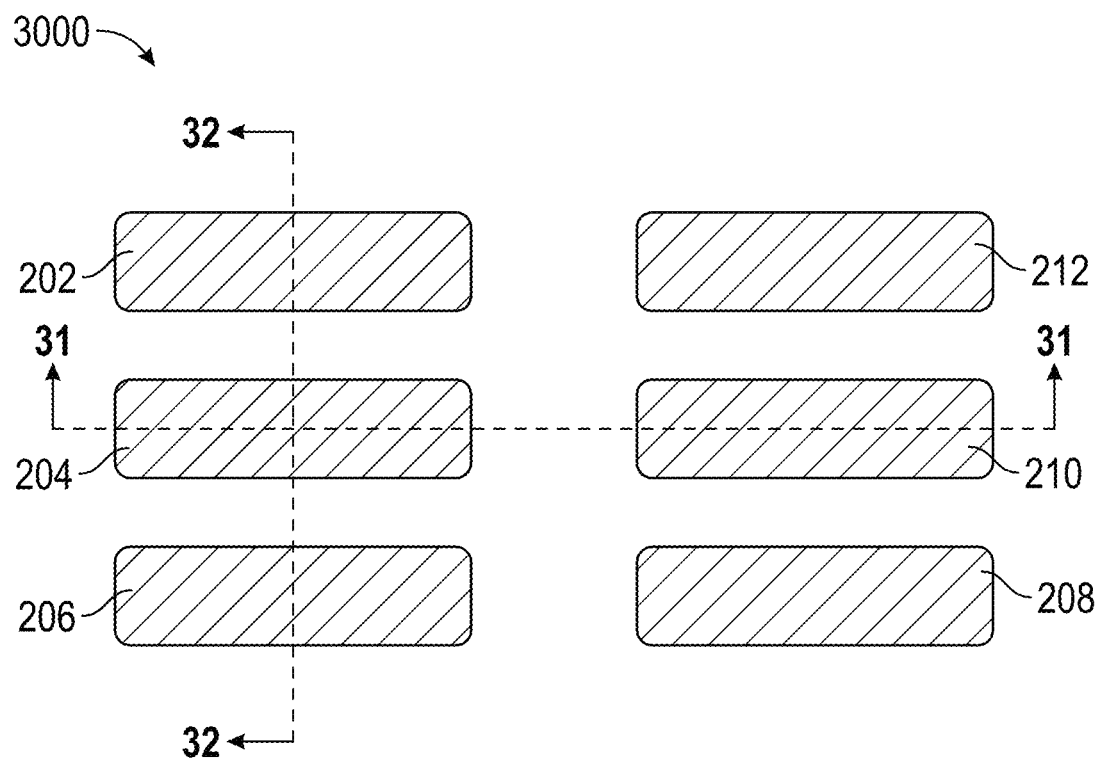
Figure 31:
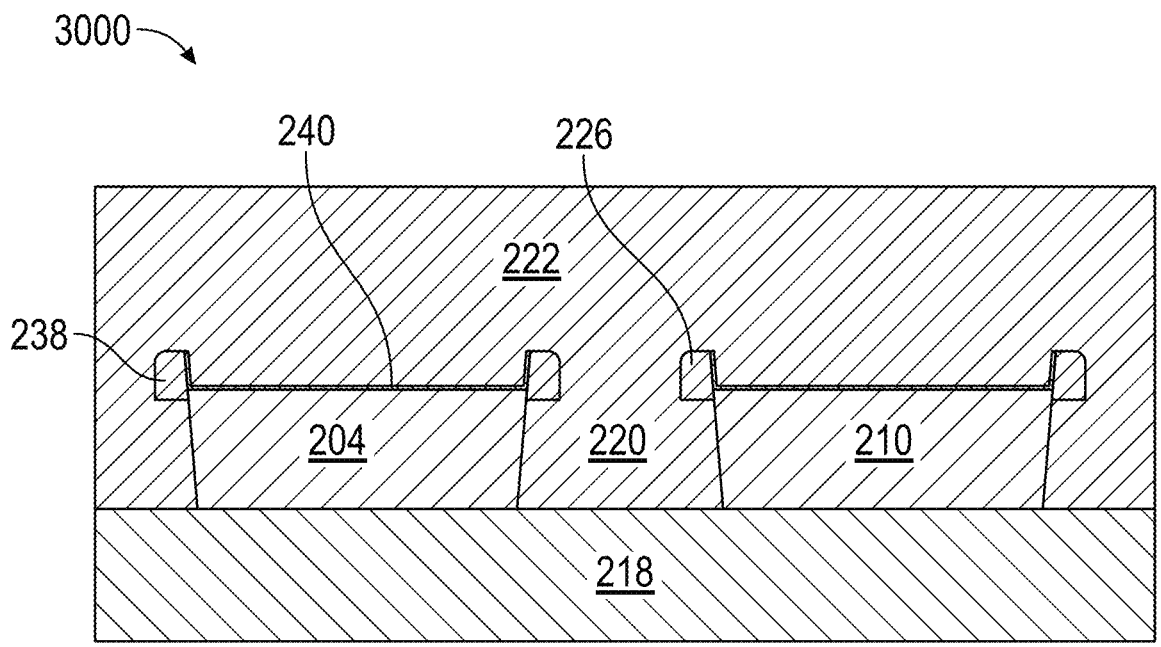
Figure 32:
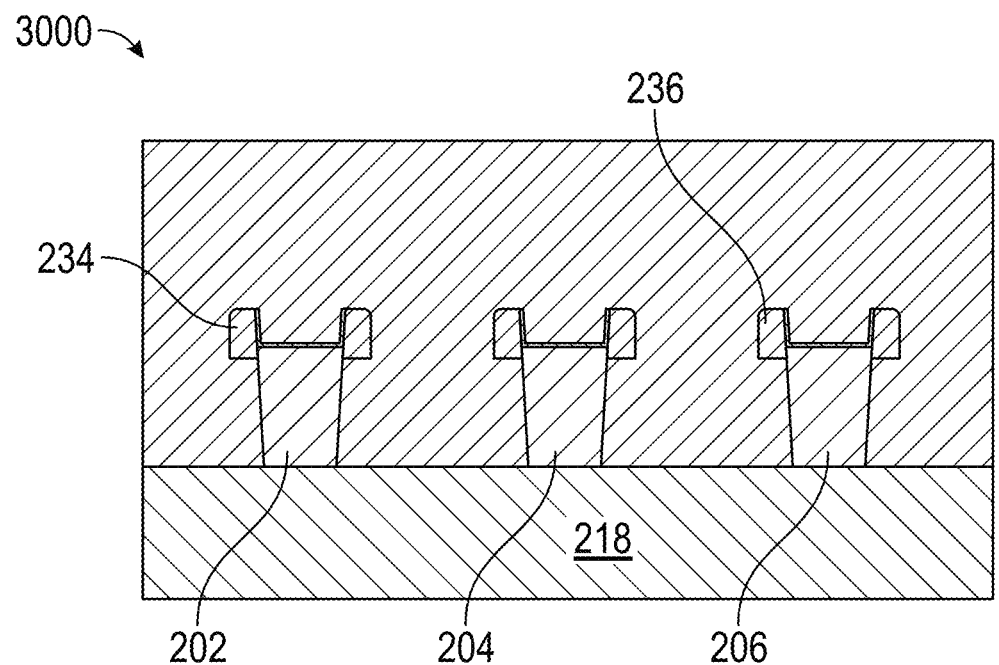

At 518, form an intermediate structure 3000 (as shown in FIG. 30 through FIG. 32) by depositing the low-k interlayer dielectric 222. The interlayer dielectric 222 provides support for subsequently forming a new layer of lines and vias.

Figure 33:
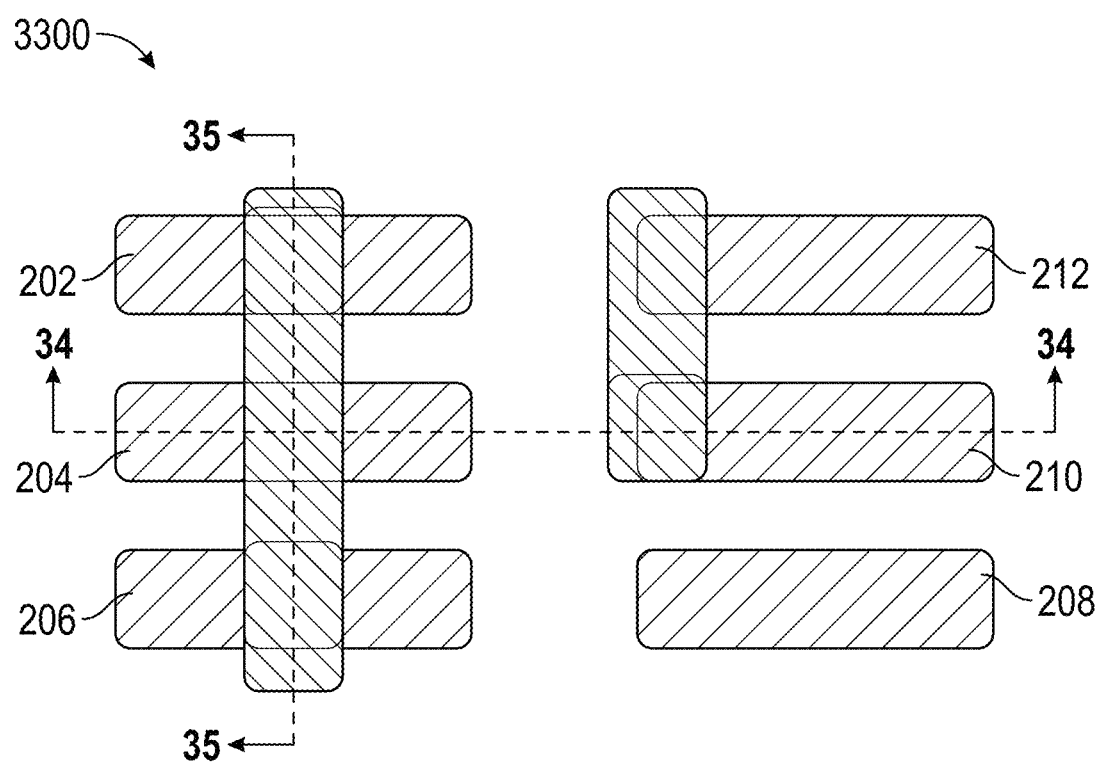
Figure 34:
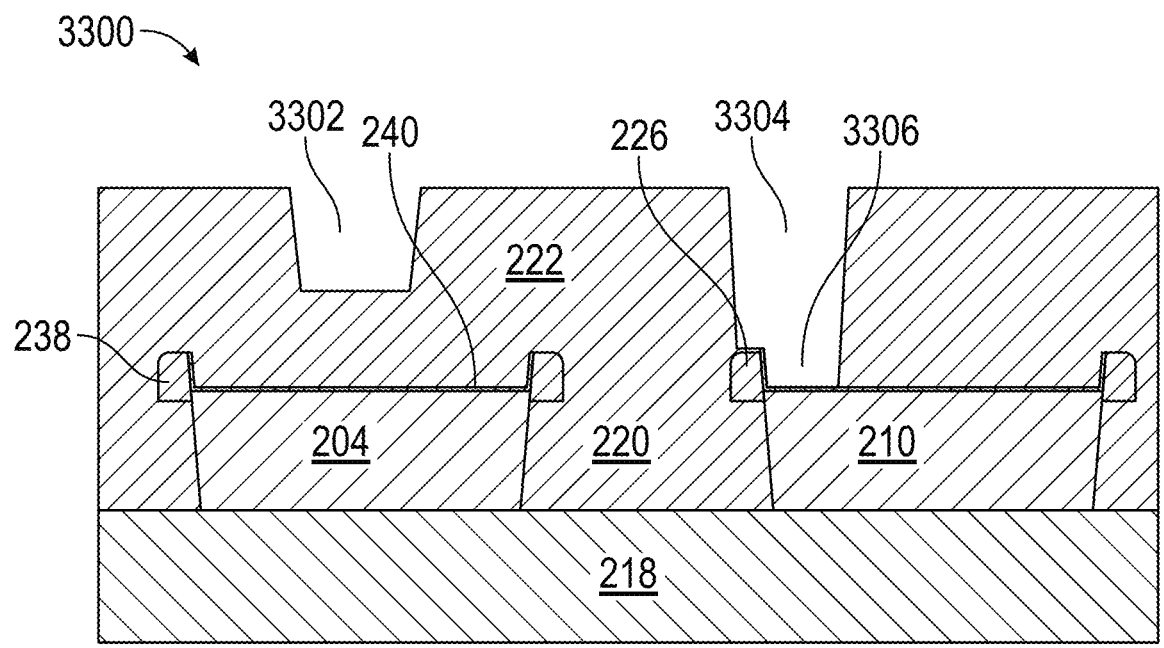
Figure 35:
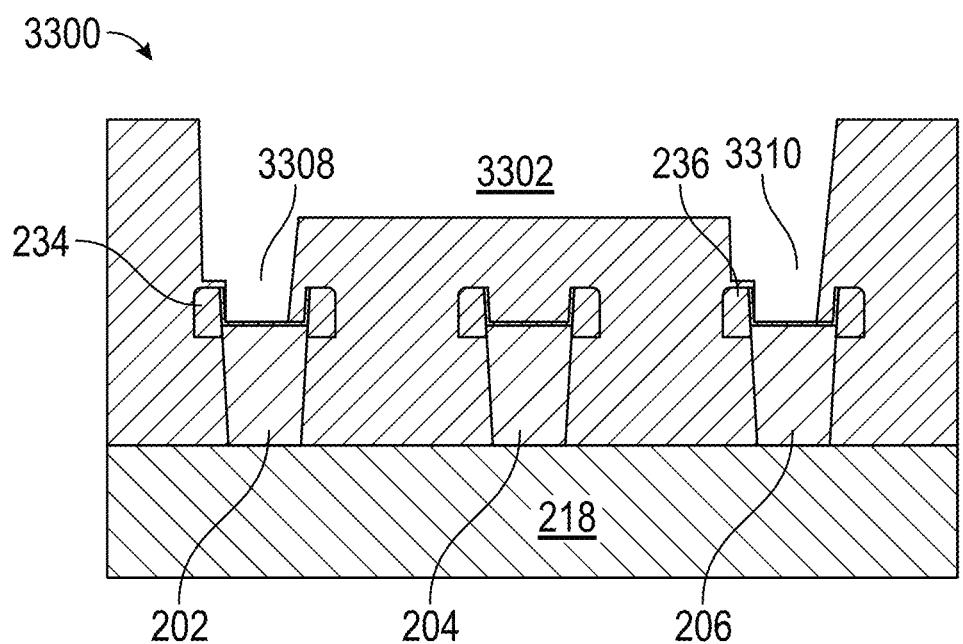

At 520, form an intermediate structure 3300 (as shown in FIG. 33 through FIG. 35) by etching trenches 3302, 3304 and vias 3306, 3308, 3310. Via etching stops on the etch stop layer 240 and on the spacers 226, 234, 236, 238. Assuming overlay error is 3 nm, as long as the spacer is thicker than 3 nm, the via contact edge will not be outside of the spacer. Therefore, the T2T rule will be complied with even if the via edge is outside of the line end. This enables compliance with T2T with a reduced or zero value for VE.

Figure 36:
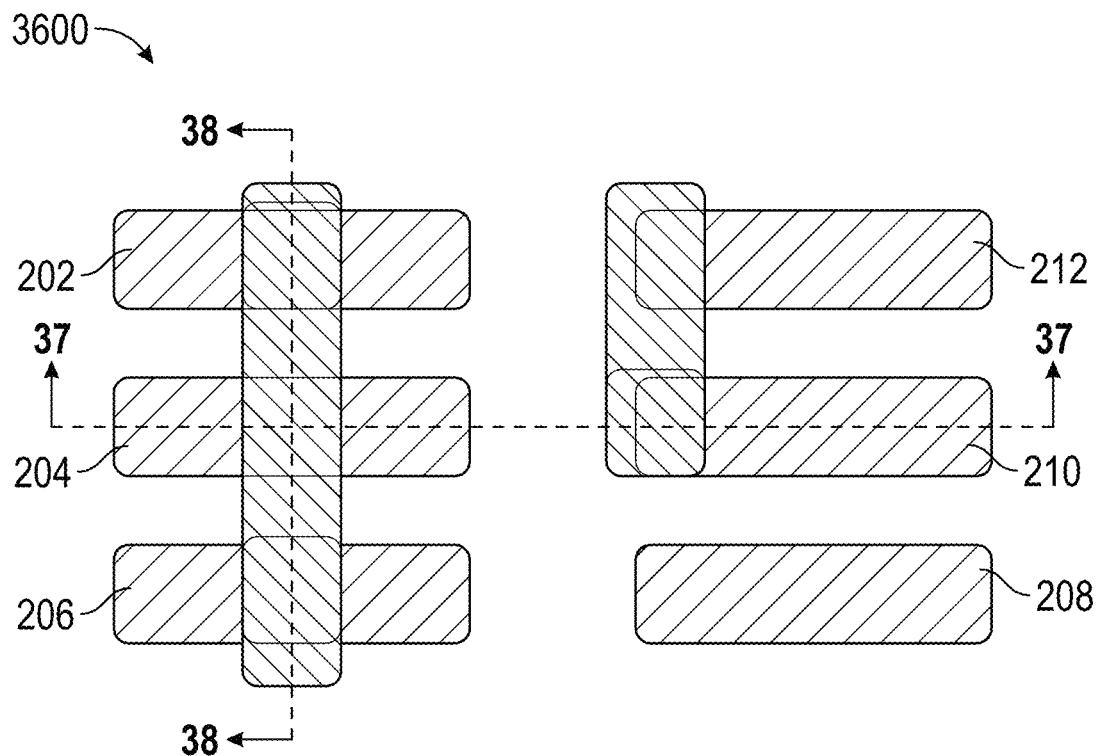
Figure 37:
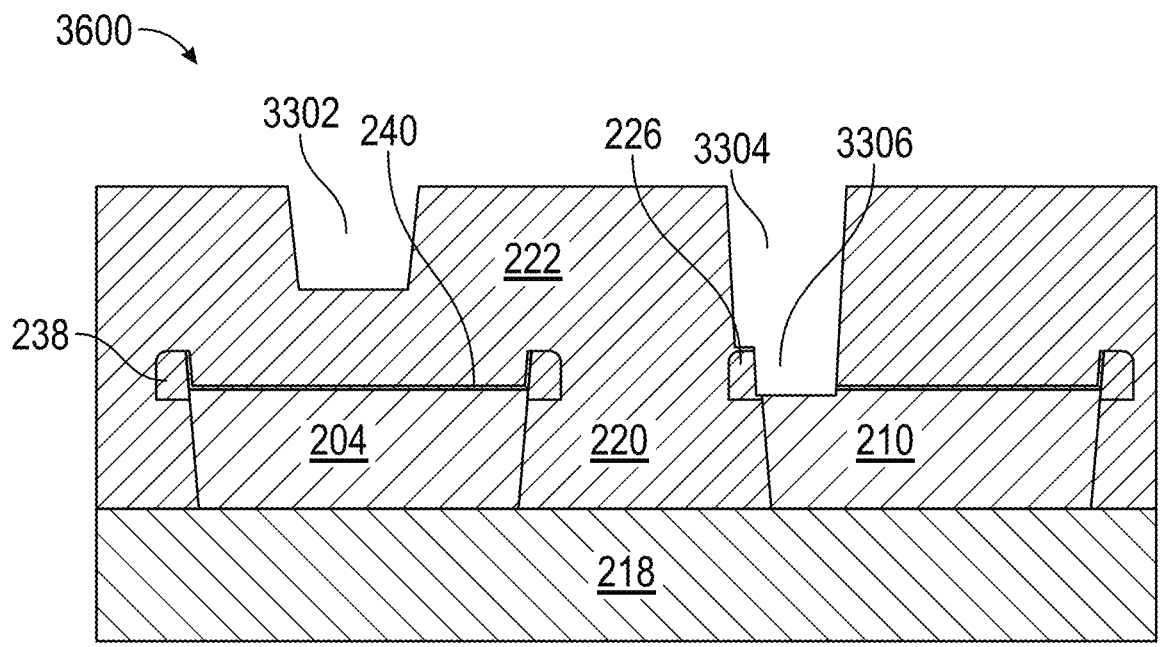
Figure 38:
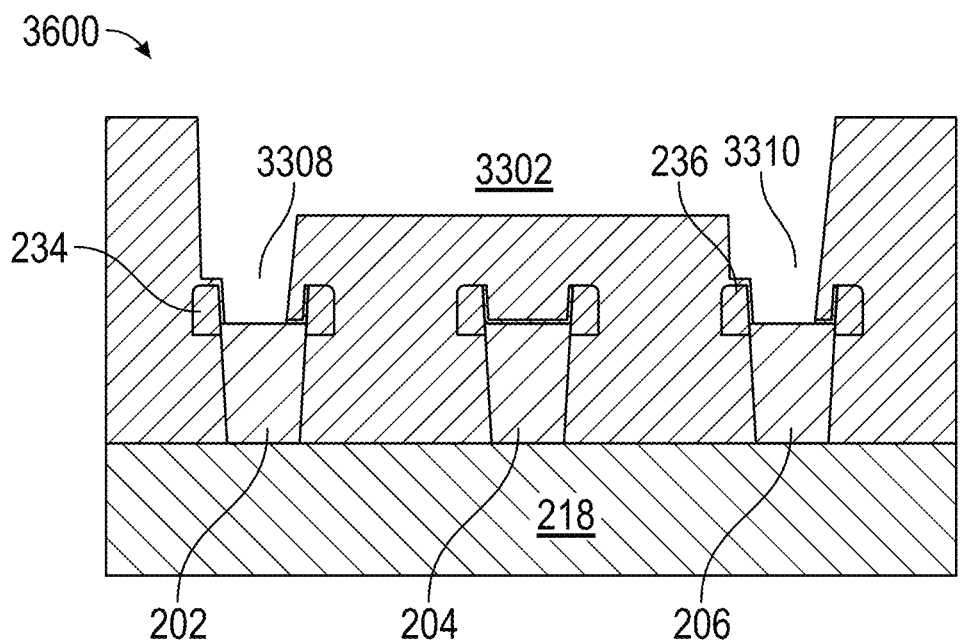

At 522, form an intermediate structure 3600 (as shown in FIG. 36 through FIG. 38) by removing exposed portions of the etch stop layer 240 from the bottoms of the vias. For example, a wet removal process can be used that is selective between the etch stop layer 240 and the other materials.

At 524, form the structure 200 (as shown in FIG. 2 through FIG. 4) by metallizing the trenches and vias. Metallization is a process that the skillful worker understands how to perform.

Figure 39:
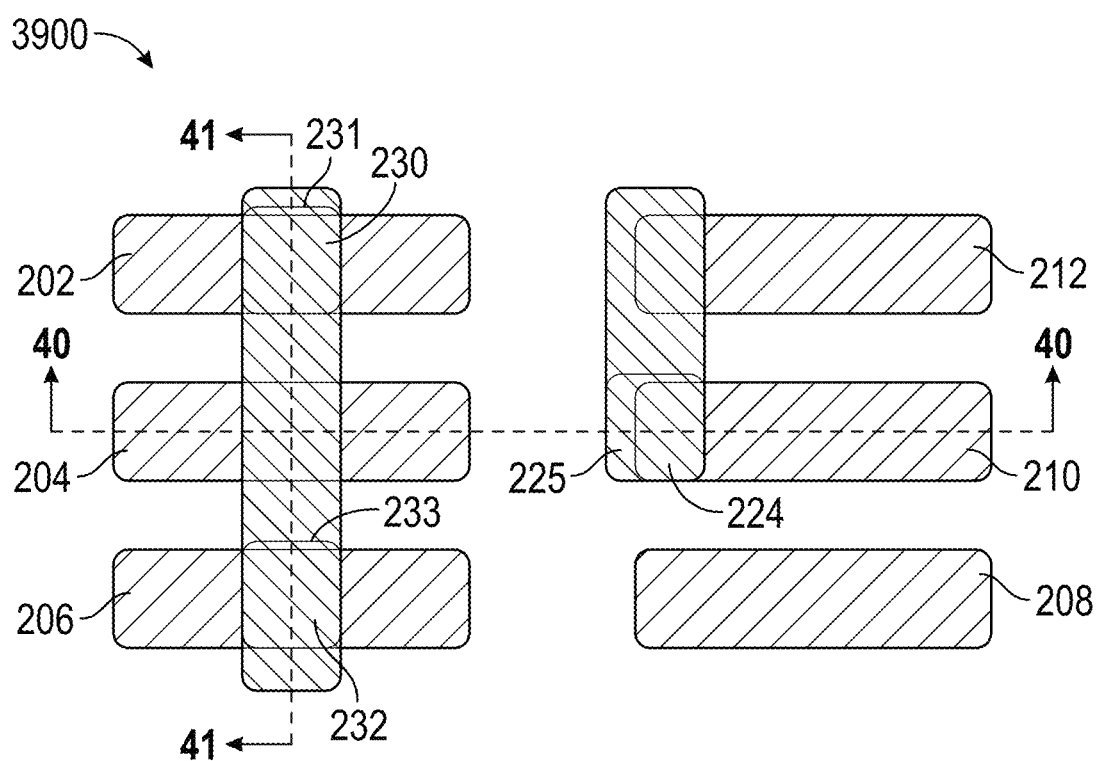
FIG. 39 depicts a plan view of an array of metal lines with spacers containing line end vias, according to exemplary embodiments.
Figure 40:
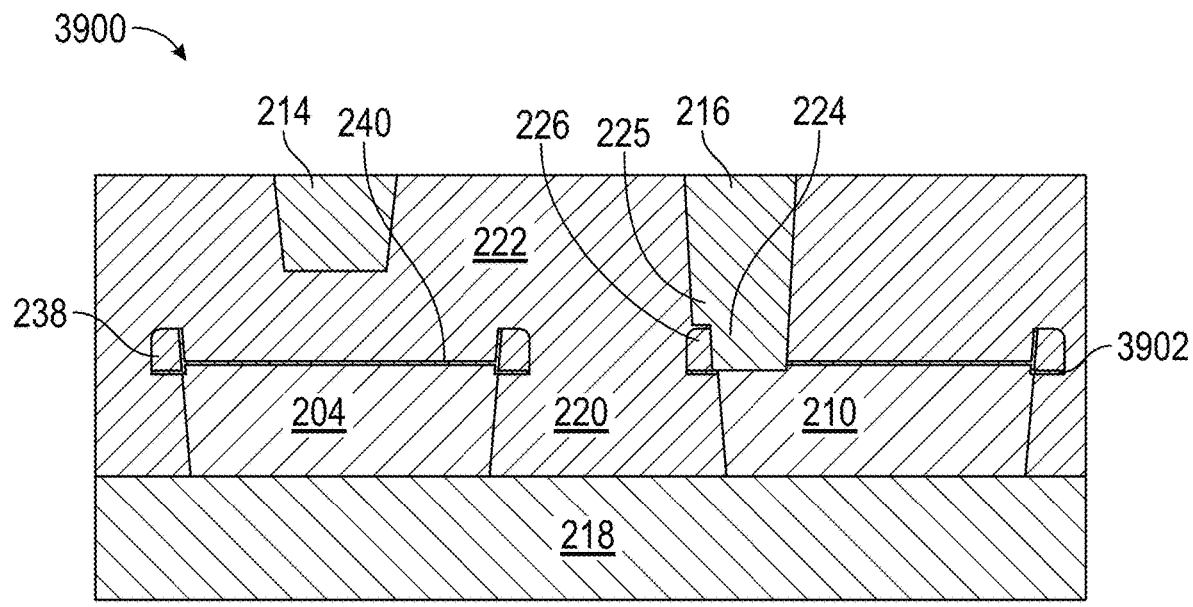
FIG. 40 depicts a sectioned view of the array of metal lines that are shown in FIG. 39.
Figure 41:
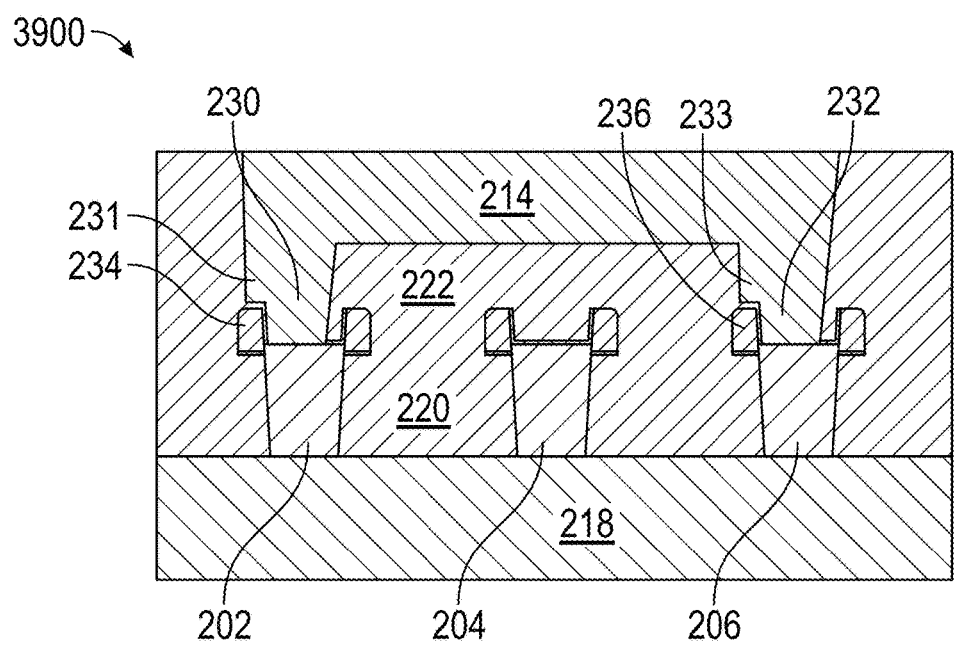
FIG. 41 depicts a sectioned view of the array of metal lines that are shown in FIG. 39.

FIG. 39 through FIG. 41 depict plan and section views of an array 3900 of lower level metal lines 202, 204, 206, 208, 210, 212, upper level metal lines 214, 216, and vias 224, 230, 232, which are built on a substrate 218 with dielectric layers 220 and 222 separating the conductive components. Components in FIG. 39 through FIG. 41 that are similar to those of FIG. 2 are similarly numbered and are not described in detail below.

In the array 3900, VE is violated without infringing T2T because spacers 226, 234, 236 surround the tops of lines 210, 202, and 206, respectively, and isolate from the adjoining lines those portions 225, 231, 233 of the respective vias 224, 230, 232 that would otherwise violate T2T. An additional spacer 238 surrounds the top of line 204. As relics of fabrication processes, further discussed below, an etch stop layer 240 covers the lines and inner surfaces of the spacers facing the lines, except where vias are present; and an etch stop layer 3902 underlies the spacers 226, 234, 236, 238. A barrier metal layer and a liner metal layer, between the lines and the dielectric, are not shown for convenience of illustration; the skillful worker is familiar with those layers and with methods for their fabrication.

Figure 42:
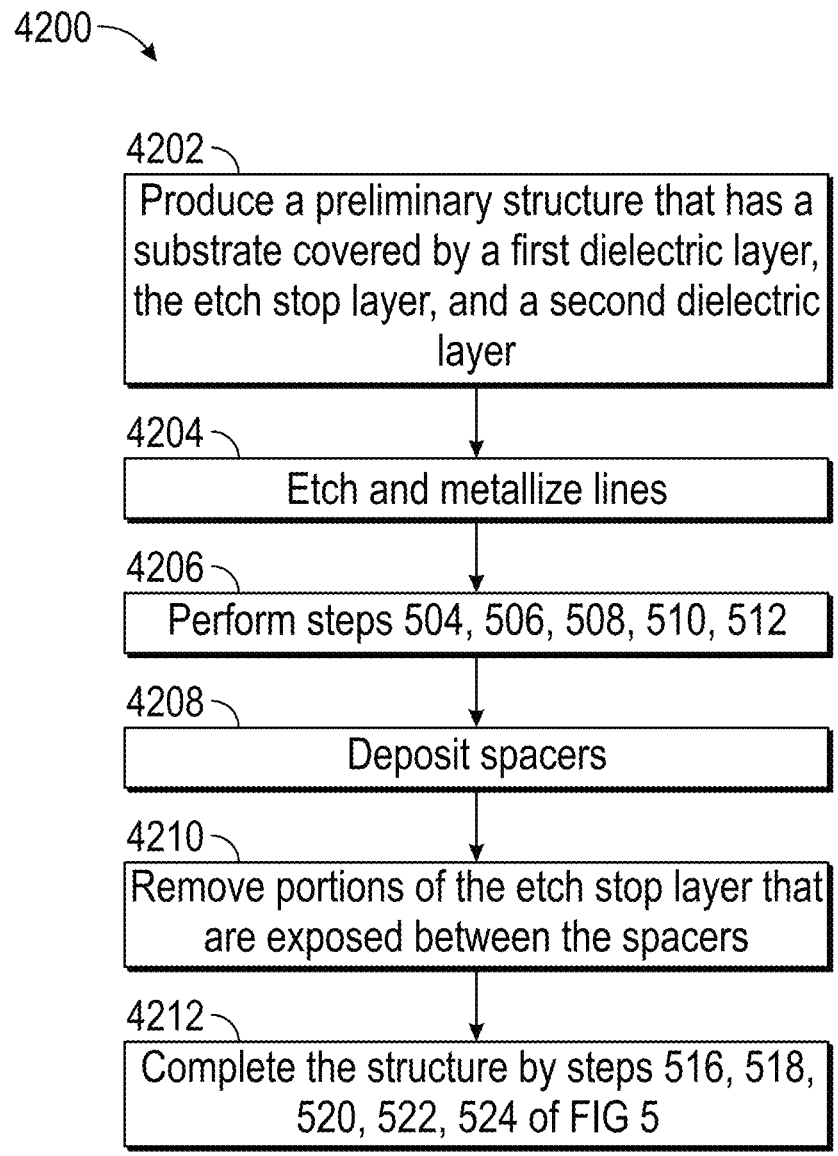
FIG. 42 depicts a flow chart of steps in a process for forming an array of metal lines as shown in FIG. 39 through FIG. 41, according to exemplary embodiments.

FIG. 42 depicts a flow chart of steps in a process 4200 for forming the array of metal lines 3900 that is shown in FIG. 39 through FIG. 41, according to exemplary embodiments. FIG. 43 through FIG. 57 depict plan and sectioned views of intermediate structures formed by selected steps of FIG. 42. Components in FIG. 43 through FIG. 57 that are similar to those of FIG. 2 are similarly numbered and are not described in detail below.

Figure 43:
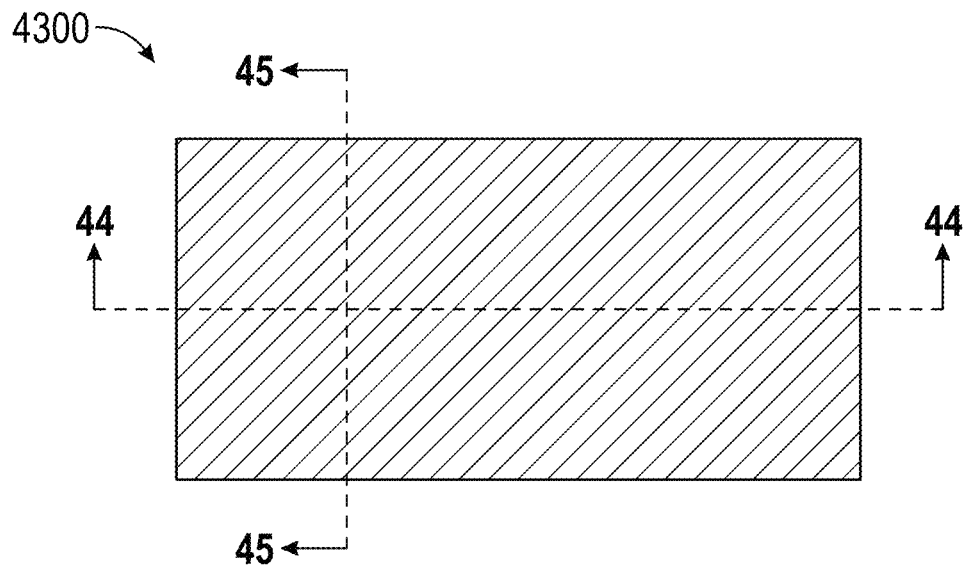
FIG. 43 through FIG. 57 depict plan and sectioned views of intermediate structures formed by selected steps of FIG. 42.
Figure 44:
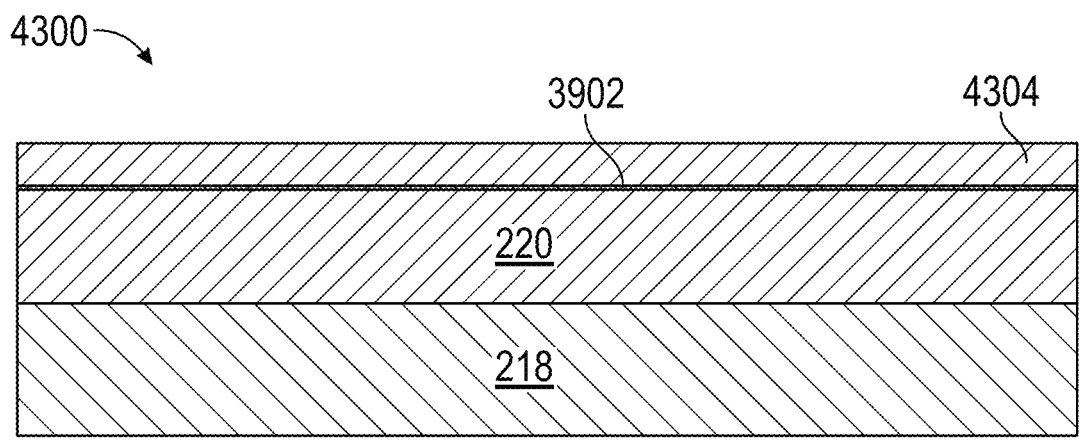
Figure 45:
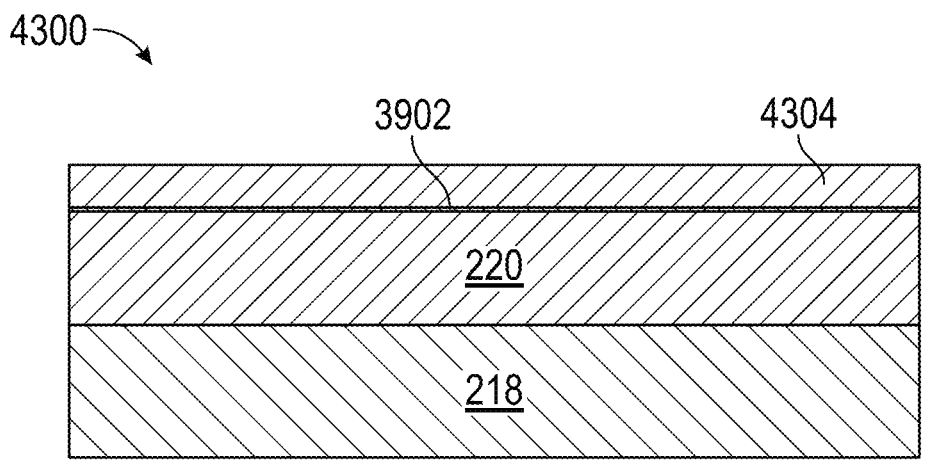

At 4202, produce a preliminary structure 4300 (as shown in FIG. 43 through FIG. 45) that has a substrate 218 covered by a first low-k dielectric layer 220, the etch stop layer 3902, and a second dielectric layer 4304. The skillful worker will appreciate methods and processes for producing such a structure.

Figure 46:
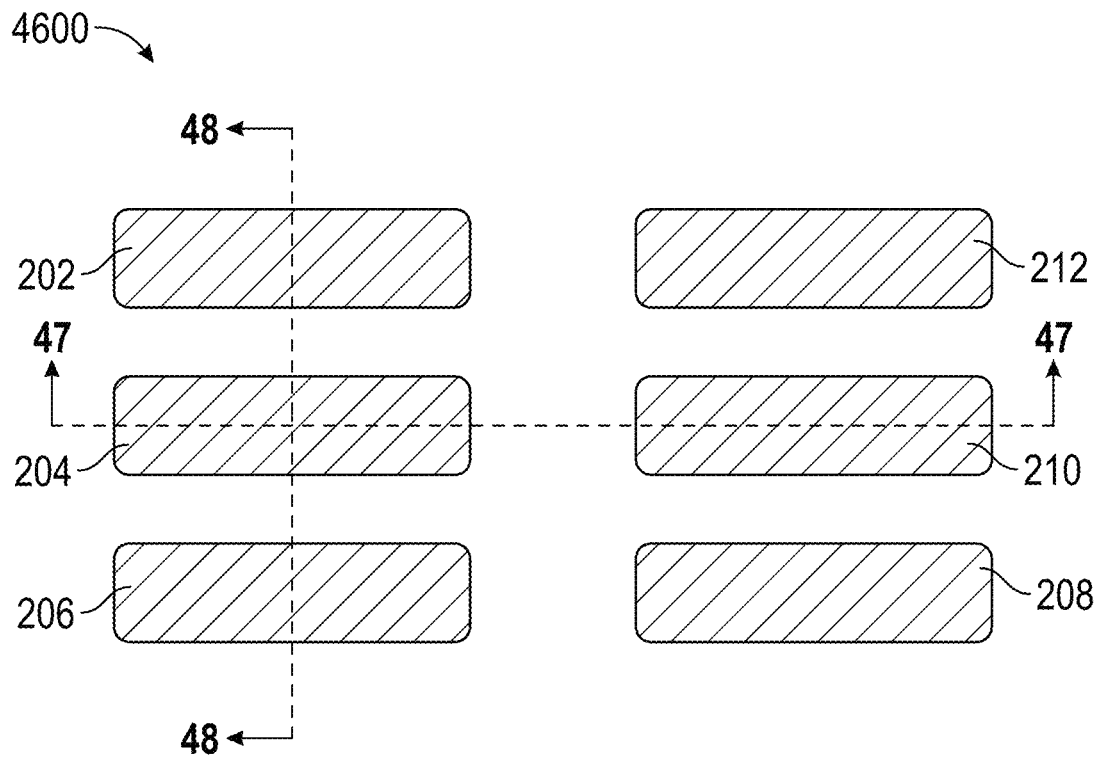
Figure 47:
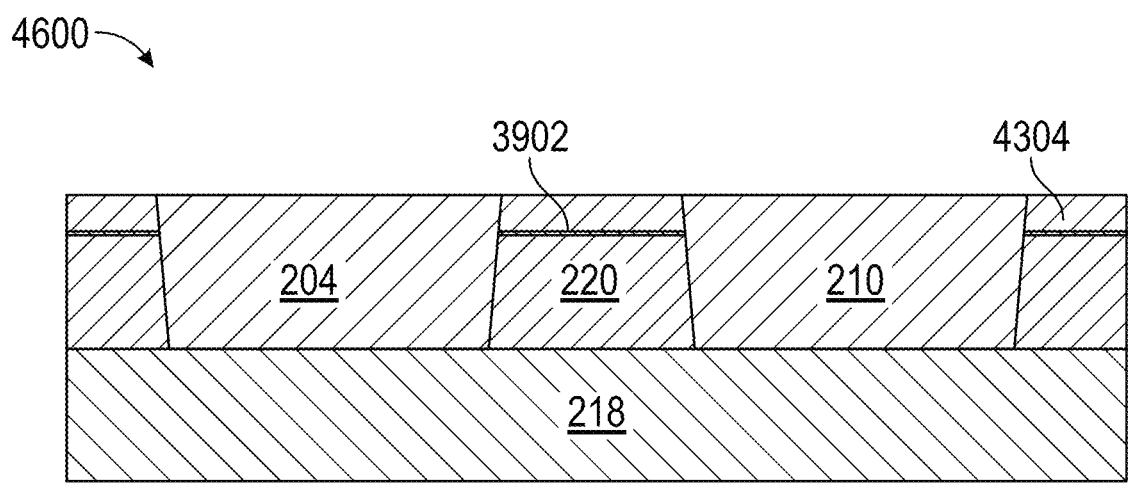
Figure 48:
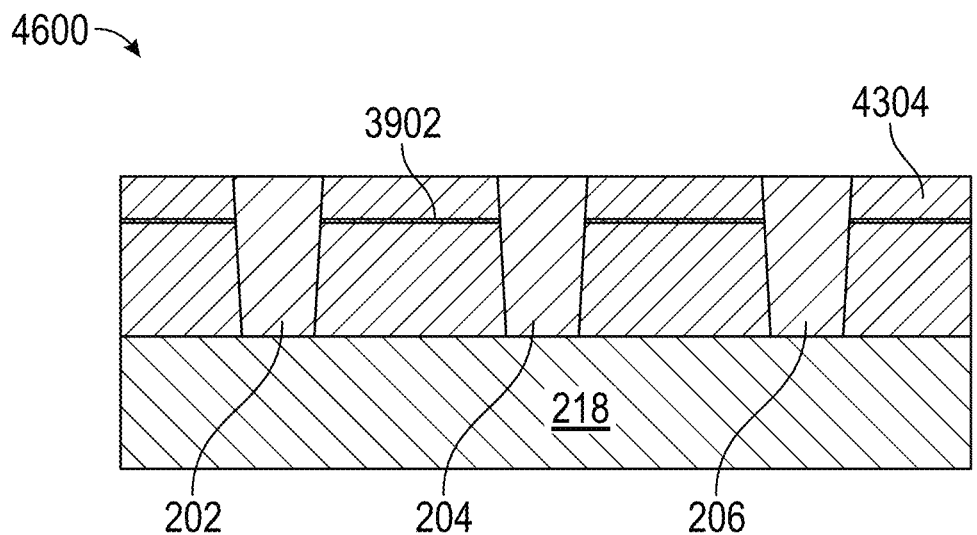

At 4204, form an intermediate structure 4600 (as shown in FIG. 46 through FIG. 48) by etching and metallizing lines 202, 204, 206, 208, 210, and 212. The intermediate structure 4600 differs from the structure 600 principally in the presence of the etch stop layer 3902 and the second dielectric layer 4304.

Figure 49:
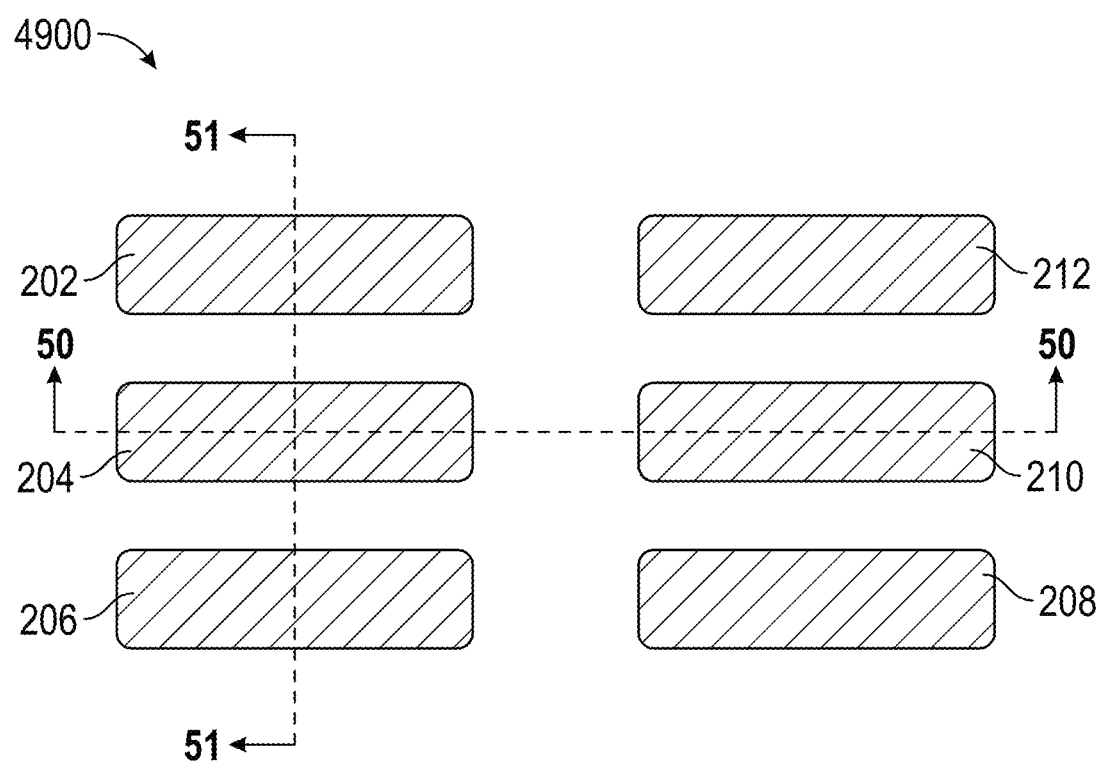
Figure 50:
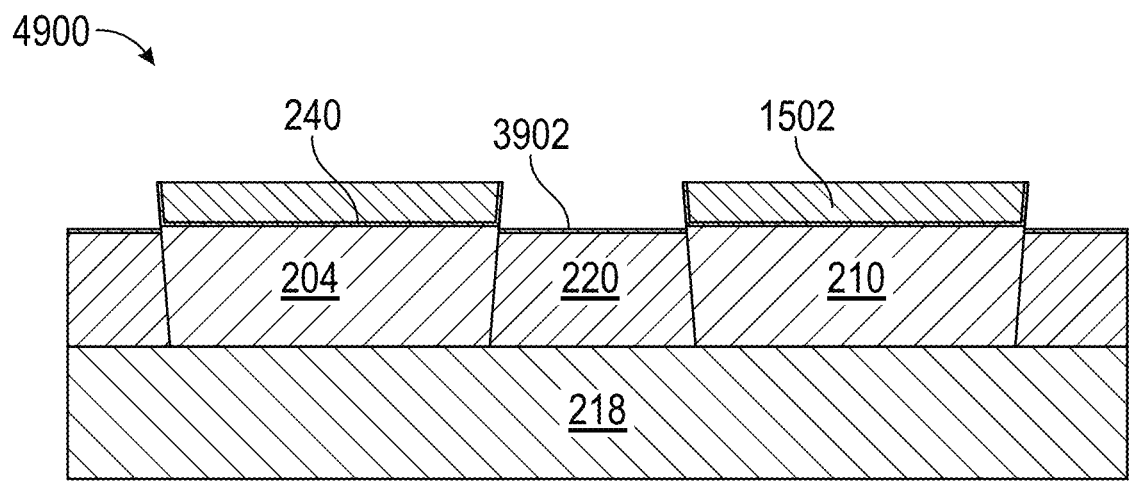
Figure 51:
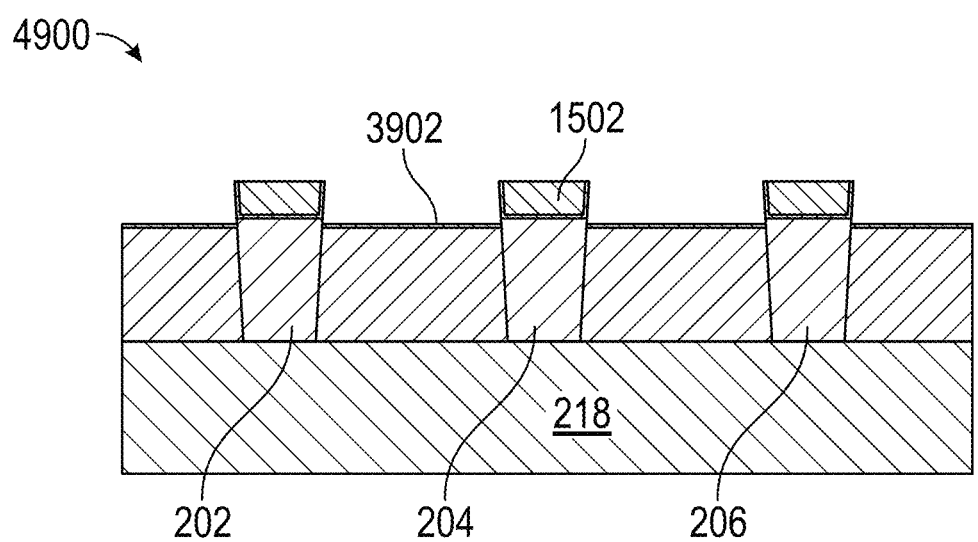

At 4206, form an intermediate structure 4900 (as shown in FIG. 49 through FIG. 51) by performing steps 504, 506, 508, 510, 512 on the intermediate structure 4600, as will be apparent to the skillful worker.

Figure 52:
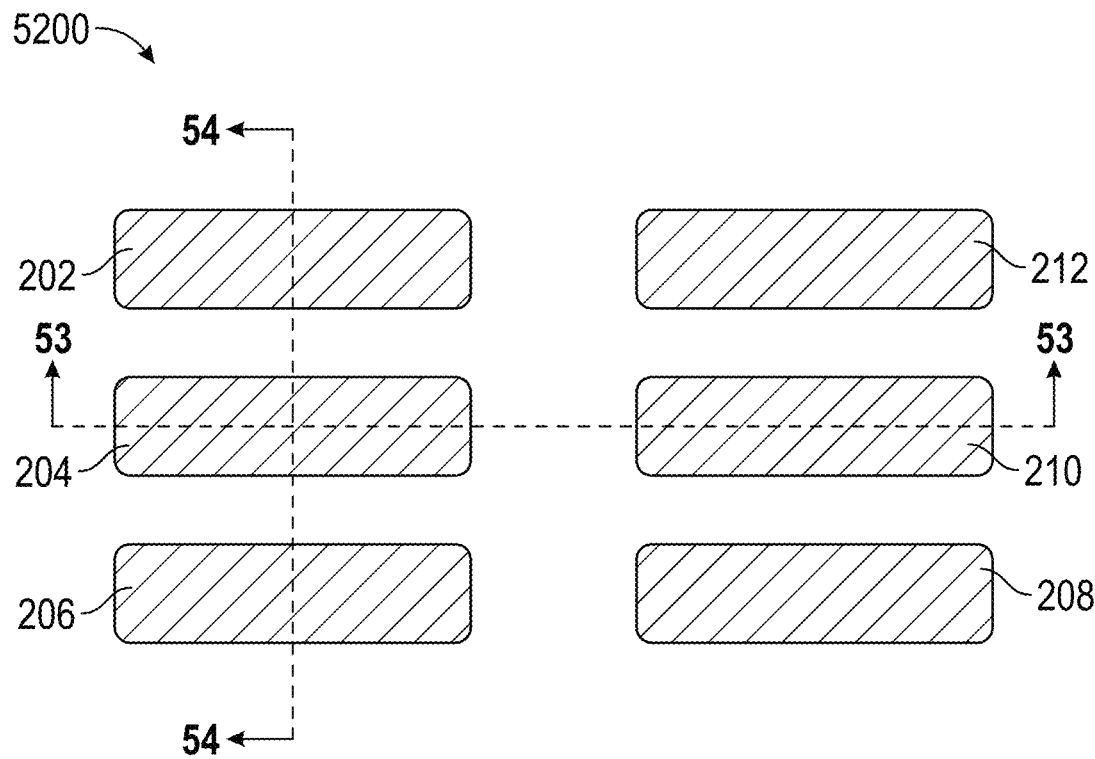
Figure 53:
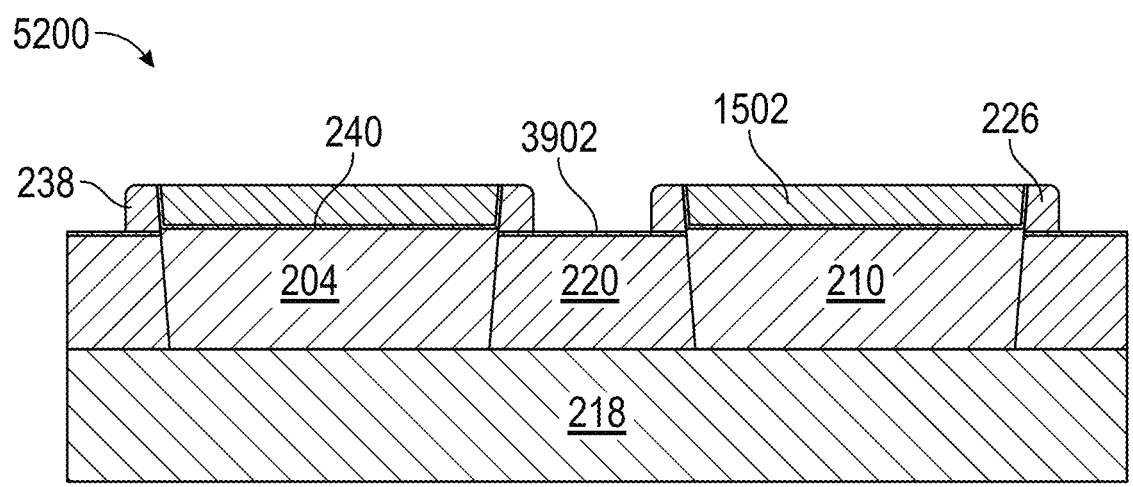
Figure 54:
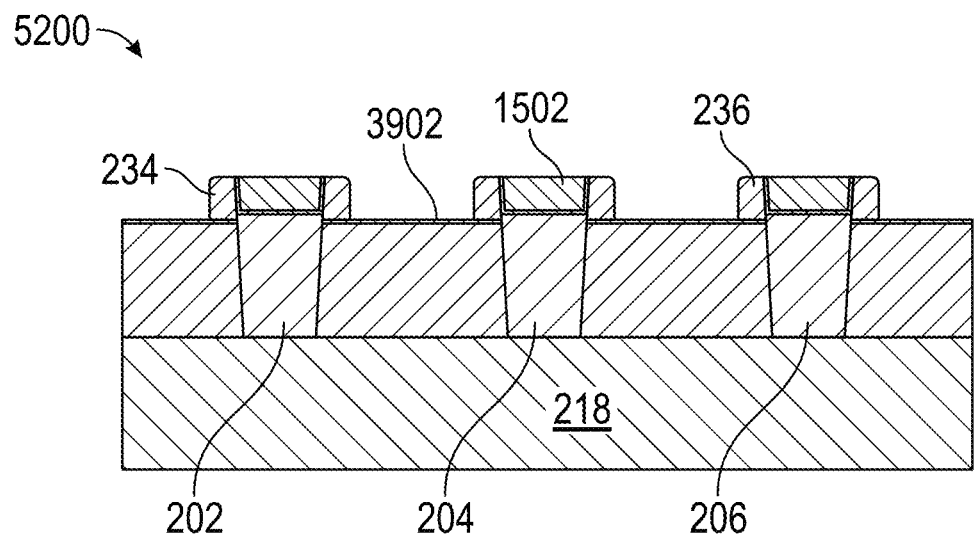

At 4208, form an intermediate structure 5200 (as shown in FIG. 52 through FIG. 54) by depositing spacers 226, 234, 236, 238 and other spacers.

Figure 55:
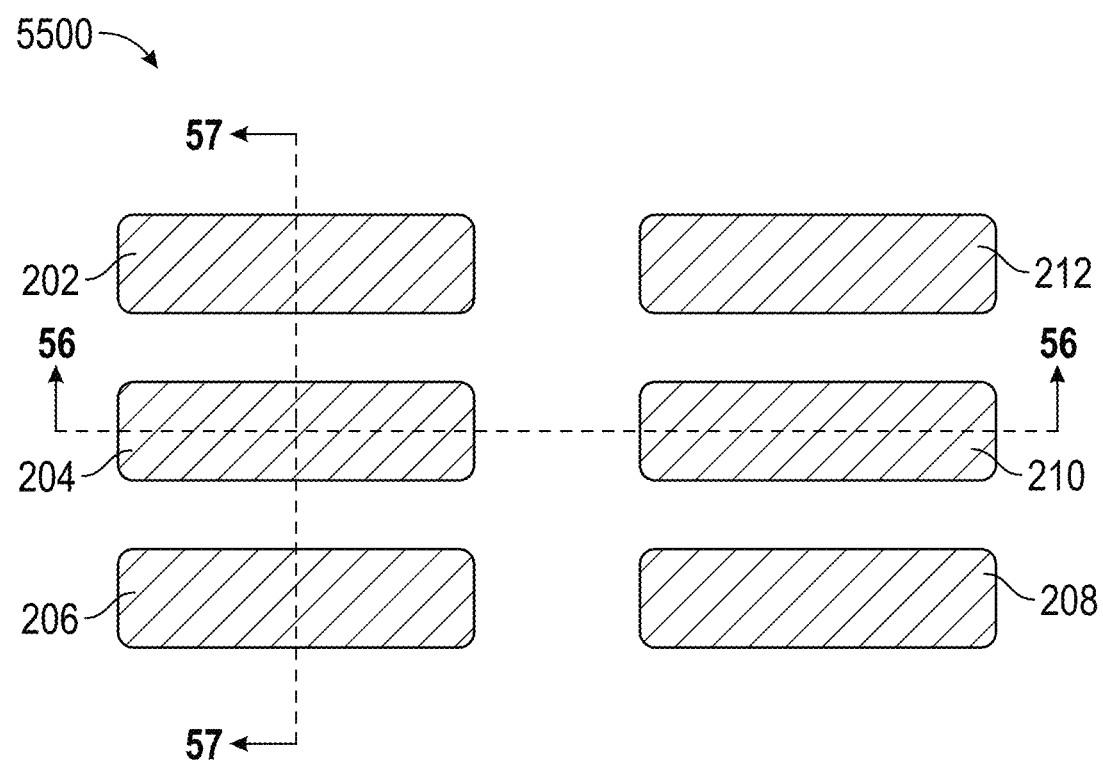
Figure 56:
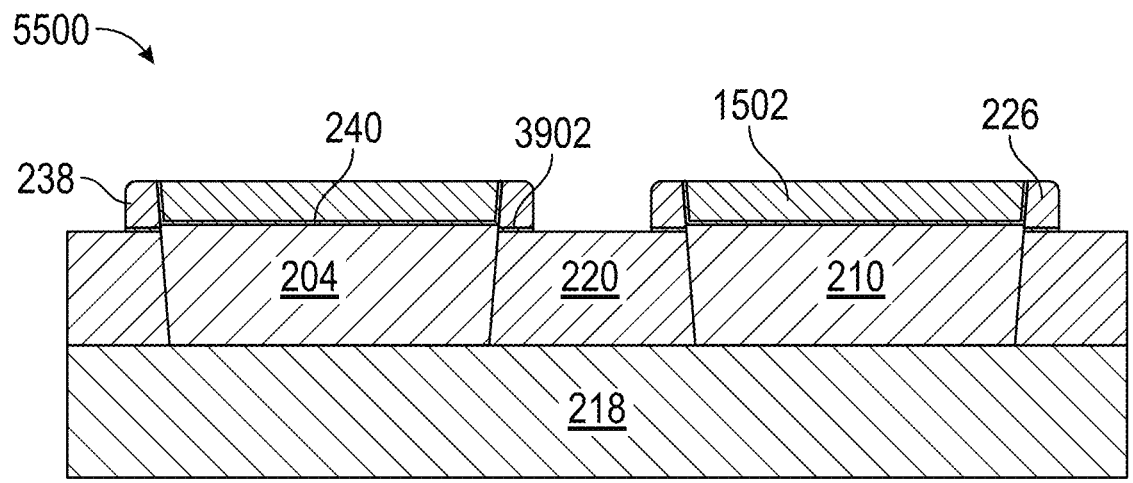
Figure 57:
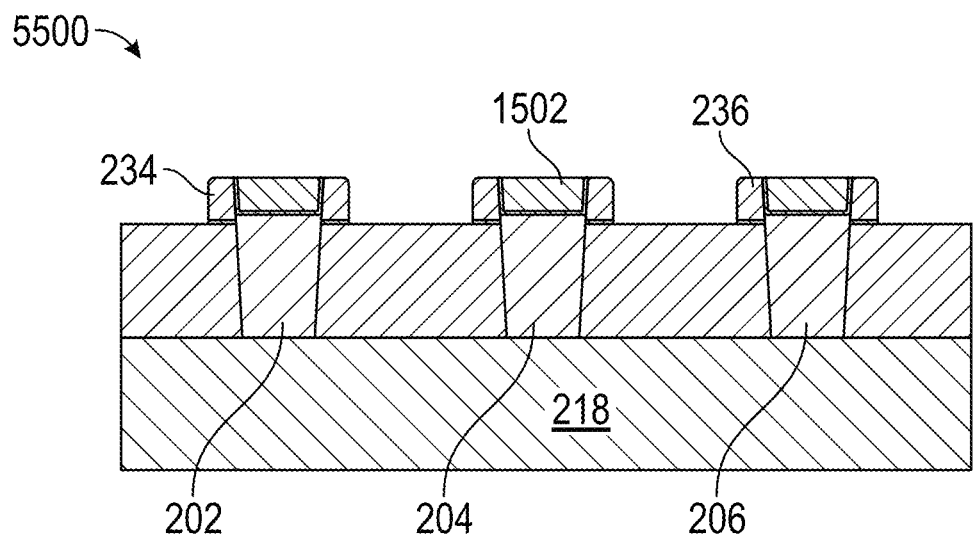

At 4210, form an intermediate structure 5500 (as shown in FIG. 55 through FIG. 57) by removing portions of the etch stop layer 3902 that are exposed between the spacers.

Then at 4212, complete the structure 3900 in a manner that will be apparent to the skillful worker, in view of steps 516, 518, 520, 522, 524 of FIG. 5.

Given the discussion thus far, it will be appreciated that, in general terms, an exemplary integrated circuit structure 200, according to an aspect of the invention, includes a metal line 202 that has an upper surface defining a periphery; a dielectric spacer 234 around the periphery of the upper surface of the metal line; and a metal via 230 that contacts the metal line and the dielectric spacer adjacent to the periphery of the upper surface.

In one or more embodiments, the dielectric spacer extends laterally at least 3 nanometers outward from the periphery of the upper surface of the metal line. In one or more embodiments, a portion of the metal via overlies a portion of the dielectric spacer that is outward from the periphery of the upper surface of the metal line.

In one or more embodiments, the structure 200 also includes a second metal line 204 that is adjacent to the metal line 202, and but for the portion of the dielectric spacer underlying the metal via, the metal via would violate a minimum distance between vias design constraint.

In one or more embodiments, the structure 200 also includes an etch stop layer 240 covering and contacting an upper surface of the metal line around where the via contacts the line. In one or more embodiments, the etch stop layer covers a part of the dielectric spacer around where the via contacts the line.

In one or more embodiments, the structure also includes an etch stop layer 3902 underlying and contacting a part of the dielectric spacer that protrudes beyond the periphery of the upper surface of the metal line.

In one or more embodiments, the dielectric spacer comprises a low-k silicon nitride. In one or more embodiments, the dielectric spacer has k less than 5. In one or more embodiments, the dielectric spacer comprises a silicon carbonitride. In one or more embodiments, the dielectric spacer comprises silicon oxycarbonitride (SiOCN).

In one or more embodiments, the dielectric spacer is located above the upper surface of the metal line.

According to another aspect, an exemplary method for making a semiconductor structure includes, at 514, depositing a spacer around the periphery of an upper surface of a metal line; and, at 524, depositing a via onto the metal line, so that a part of the via overlaps the spacer. In one or more embodiments, a part of the spacer overhangs outside the periphery of the metal line. In one or more embodiments, the part of the via that overlaps the spacer includes a portion that overlaps the part of the spacer that overhangs outside the periphery of the metal line.

In one or more embodiments, the method also includes, before depositing the spacer, preparing for the deposition of the spacer by: at 504, recessing the metal line into a low-k dielectric layer; at 506, depositing an etch stop layer that covers the metal line and the low-k dielectric layer; at 508, filling a recessed portion of the etch stop layer with a sacrificial material, then planarizing to remove portions of the etch stop layer that are not covered by the sacrificial material; and, at 512, forming a ledge for deposition of the spacer by recessing the low-k dielectric layer selective to the sacrificial material.

In one or more embodiments, the exemplary method also includes, after deposition of the spacer, then at 516, removing the sacrificial material. In one or more embodiments, the exemplary method also includes, at 518, filling with a further layer of low-k dielectric. In one or more embodiments, the method also includes, before depositing the via, etching the via into the further layer of low-k dielectric at 520. In one or more embodiments, the etched via overlaps the spacer and the metal line.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (ME), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit structure comprising:
   a metal line that has an upper surface defining a periphery, the metal line having a first height;
   a dielectric spacer having a second height, wherein the second height is less than the first height, the dielectric spacer having a lower dielectric spacer surface bordering the periphery of the upper surface of the metal line and an upper dielectric spacer surface, opposite the lower dielectric spacer surface, extending away from the metal line;
   a metal via that contacts the metal line and the dielectric spacer adjacent to the periphery of the upper surface; and
   an interlayer dielectric surrounding the metal line, the dielectric spacer, and the metal via.

2. The structure of claim 1, wherein the dielectric spacer extends laterally at least 3 nanometers outward from the periphery of the upper surface of the metal line.

3. The structure of claim 2, wherein a portion of the metal via overlies a portion of the dielectric spacer that is outward from the periphery of the upper surface of the metal line.

4. The structure of claim 3, further comprising a second metal line adjacent to the metal line, wherein but for the portion of the dielectric spacer underlying the metal via, the metal via would violate a minimum distance between vias design constraint.

5. The structure of claim 2, further comprising an etch stop layer covering and contacting the upper surface of the metal line around where the metal via contacts the line.

6. The structure of claim 5, wherein the etch stop layer covers a part of the dielectric spacer around where the metal via contacts the line.

7. The structure of claim 2, further comprising an etch stop layer underlying and contacting the lower dielectric spacer surface of the dielectric spacer that protrudes beyond the periphery of the upper surface of the metal line and contacting an adjacent surface of the dielectric spacer.

8. The structure of claim 1, wherein the dielectric spacer comprises a low-k silicon nitride.

9. The structure of claim 8, wherein the dielectric spacer has k less than 5.

10. The structure of claim 9, wherein the dielectric spacer comprises a silicon carbonitride.

11. The structure of claim 10, wherein the dielectric spacer comprises silicon oxycarbonitride (SiOCN).

12. The structure of claim 1, wherein the dielectric spacer is located above the upper surface of the metal line.

* * * * *